(12) United States Patent
Kwak

(10) Patent No.: US 9,053,794 B2
(45) Date of Patent: Jun. 9, 2015

(54) NONVOLATILE MEMORY DEVICE AND RELATED METHOD OF OPERATION

(75) Inventor: Dong-Hun Kwak, Hwaseong-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 526 days.

(21) Appl. No.: 13/540,951

(22) Filed: Jul. 3, 2012

(65) Prior Publication Data

US 2013/0100737 A1    Apr. 25, 2013

(30) Foreign Application Priority Data

Oct. 19, 2011    (KR) .................. 10-2011-0106858

(51) Int. Cl.
G11C 11/34    (2006.01)
G11C 16/10    (2006.01)
G11C 16/04    (2006.01)
G11C 16/34    (2006.01)
H01L 27/115    (2006.01)

(52) U.S. Cl.
CPC ............ G11C 16/10 (2013.01); G11C 16/0483 (2013.01); G11C 16/3459 (2013.01); H01L 27/1157 (2013.01); H01L 27/11582 (2013.01)

(58) Field of Classification Search
CPC .... G11C 16/0483; G11C 16/10; G11C 16/16; G11C 16/14; G11C 16/26; G11C 16/08; G11C 16/04; G11C 16/3445; G11C 16/0408
USPC ............. 365/185.03, 185.05, 185.22, 185.29, 365/185.11
See application file for complete search history.

(56) References Cited

U.S. PATENT DOCUMENTS

| | | | |
|---|---|---|---|
| 7,499,317 B2 | 3/2009 | Ito | |
| 7,804,718 B2 | 9/2010 | Kim | |
| 8,913,431 B1 * | 12/2014 | Costa et al. | 365/185.11 |
| 2005/0083735 A1 * | 4/2005 | Chen et al. | 365/185.17 |
| 2009/0059660 A1 * | 3/2009 | Lee et al. | 365/185.02 |
| 2009/0151238 A1 * | 6/2009 | De Queiroz | 44/452 |
| 2010/0002515 A1 | 1/2010 | Lutze et al. | |
| 2010/0226183 A1 | 9/2010 | Kim | |
| 2011/0249495 A1 * | 10/2011 | Cho et al. | 365/185.03 |
| 2013/0051149 A1 * | 2/2013 | Cerafogli et al. | 365/185.18 |

FOREIGN PATENT DOCUMENTS

| | | |
|---|---|---|
| JP | 2010507180 A | 3/2010 |
| KR | 1020090091127 A | 8/2009 |
| KR | 1020100010675 A | 2/2010 |
| KR | 1020100015423 A | 2/2010 |
| KR | 1020110038117 A | 4/2011 |
| KR | 1020110095104 A | 8/2011 |

* cited by examiner

*Primary Examiner* — Hien Nguyen
(74) *Attorney, Agent, or Firm* — Volentine & Whitt, PLLC

(57) ABSTRACT

A nonvolatile memory comprises a memory block having memory cells stacked in a three dimensional structure. The nonvolatile memory device performs an erase operation to erase a selected sub block among sub blocks of the memory block, a verification operation to determine whether program states of memory cells of an unselected sub block of the memory block have changed as a consequence of the erase operation, and a reprogramming operation to reprogram at least a portion of the unselected sub block upon determining that at least one of the program states have changed as a consequence of the erase operation.

20 Claims, 23 Drawing Sheets

Fig. 9

| SSL | Float |
|---|---|
| WLs of unselected sub block | Float |
| WLs of selected sub block | Vwe |
| GSL | Float |
| Substrate | Vers |

NONVOLATILE MEMORY DEVICE AND RELATED METHOD OF OPERATION

CROSS-REFERENCE TO RELATED APPLICATIONS

This application claims priority under 35 U.S.C. §119 to Korean Patent Application No. 10-2011-0106858 filed on Oct. 19, 2011, the disclosure of which is hereby incorporated by reference in its entirety.

BACKGROUND OF THE INVENTION

The inventive concept relates generally to semiconductor memory devices. More particularly, the inventive concept relates to a nonvolatile memory device having a three-dimensional (3D) structure and related methods of operation.

Semiconductor memory devices can be roughly divided into two categories according to whether they retain stored data when disconnected from power. These categories include volatile memory devices, which lose stored data when disconnected from power, and nonvolatile memory devices, which retain stored data when disconnected from power. Examples of volatile memory devices include static random access memory (SRAM), dynamic random access RAM (DRAM), and synchronous DRAM (SDRAM). Examples of nonvolatile memory devices include read only memory (ROM), programmable ROM (PROM), electrically programmable ROM (EPROM), electrically erasable and programmable ROM (EEPROM), flash memory device, phase-change RAM (PRAM), magnetic RAM (MRAM), resistive RAM (RRAM), and ferroelectric RAM (FRAM). Flash memory is a type of EEPROM and it is generally formed in one of two configurations to produce NOR-type flash memory or NAND-type flash memory.

In an effort to increase the storage capacity of flash memory devices, researchers have developed a three-dimensional (3D) array structure in which arrays of flash memory cells are stacked on top of each other. The development of reliable, high performance 3D array structures is an ongoing process and stands to benefit from continuing innovation.

SUMMARY OF THE INVENTION

In an embodiment of the inventive concept, a method is provided for operating a nonvolatile memory device comprising a memory block having memory cells stacked in a three dimensional structure. The method comprises performing an erase operation to erase a selected sub block among sub blocks of the memory block, performing a verification operation comprising determining whether program states of memory cells of an unselected sub block of the memory block have changed as a consequence of the erase operation, and performing a reprogramming operation to reprogram at least a portion of the unselected sub block upon determining that at least one of the program states have changed as a consequence of the erase operation.

In another embodiment of the inventive concept, a nonvolatile memory device comprises a memory cell array comprising a memory block having memory cells stacked in a three dimensional structure, and a controller configured to control the memory cell array such that sub blocks of the memory block are erased independent of each other, wherein an erase operation erases a selected sub block among sub blocks of the memory block, a verification operation determines whether program states of memory cells of an unselected sub block of the memory block have changed as a consequence of the erase operation, and a reprogramming operation that reprograms at least a portion of the unselected sub block upon determining that at least one of the program states have changed as a consequence of the erase operation.

In another embodiment of the inventive concept, a method is provided for operating a nonvolatile memory device comprising a memory block formed in a stacked three dimensional structure. The method comprises storing a backup copy of data stored in a first sub block of the memory block, erasing a second sub block of the memory block located adjacent to the first sub block, and reprogramming the first sub block based on the backup copy after erasing the second sub block.

BRIEF DESCRIPTION OF THE DRAWINGS

The drawings illustrate selected embodiments of the inventive concept. In the drawings, like reference numbers indicate like features. In addition, the relative dimensions or sizes of various features may be exaggerated for clarity of illustration.

FIG. 9 is a table illustrating voltage conditions applied to the memory block of FIG. 8 when an erase operation is performed on a nonvolatile memory device according to an embodiment of the inventive concept.

DETAILED DESCRIPTION

Embodiments of the inventive concept are described below with reference to the accompanying drawings. These embodiments are presented as teaching examples and should not be construed to limit the scope of the inventive concept.

In the description that follows, where a feature is referred to as being "connected" or "coupled" to another feature, it can be directly connected or coupled to the other feature or intervening features may be present. As used herein, the singular forms "a", "an" and "the" are intended to encompass the plural forms as well, unless the context clearly indicates otherwise. Terms such as "comprises", "comprising,", "includes", "including", and the like, where used in this specification, indicate the presence of stated features but do not preclude the presence or addition of other features.

Figure 1:
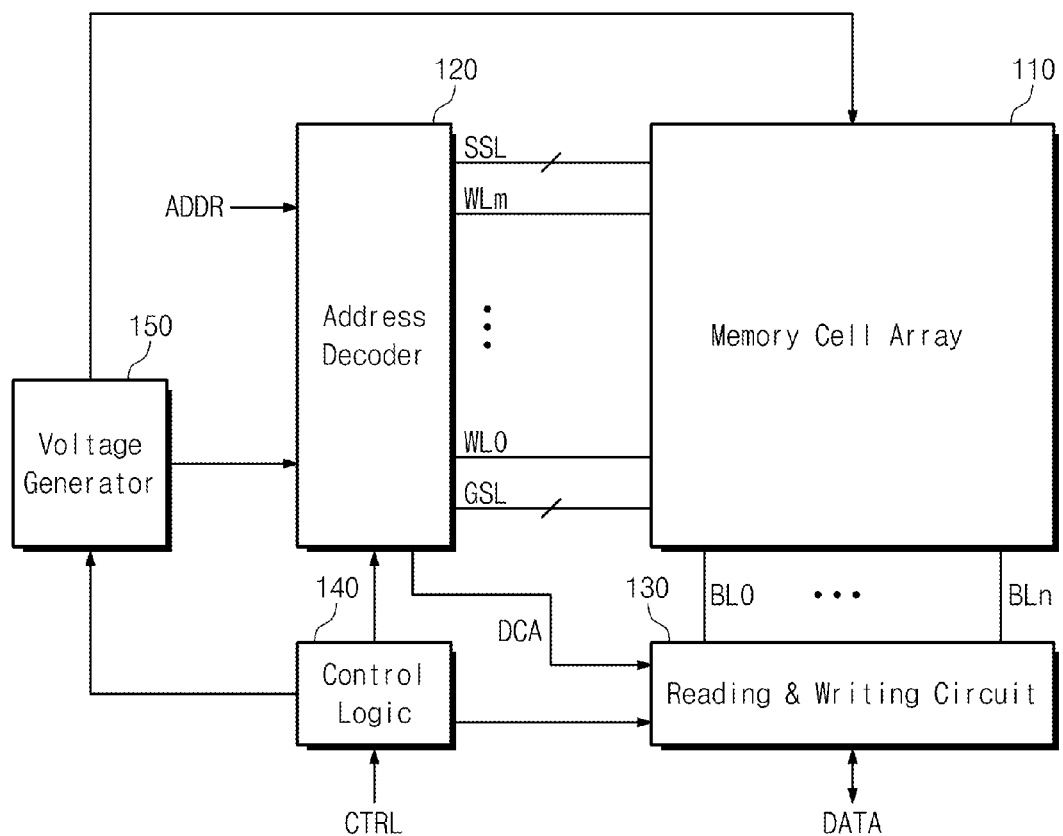
FIG. 1 is a block diagram illustrating a nonvolatile memory device according to an embodiment of the inventive concept.

FIG. 1 is a block diagram illustrating a nonvolatile memory device 100 according to an embodiment of the inventive concept.

Referring to FIG. 1, nonvolatile memory device 100 comprises a memory cell array 110, an address decoder 120, a read/write circuit 130, control logic 140 and a voltage generator 150.

Memory cell array 110 comprises a plurality of cell strings arranged along a row direction and a column direction on a substrate. Each of the cell strings comprises a plurality of memory cells stacked along a direction perpendicular to the substrate. Accordingly, memory cells are provided along a row and a column on the substrate and stacked along a direction perpendicular to the substrate to form a 3D structure.

Memory cell array 110 comprises a plurality of memory cells that can store one or more bits per memory cell. A memory cell configured to store one bit is called a single level cell (SLC), and a memory cell configured to store more than one bit is called a multi level cell (MLC).

Address decoder 120 is coupled to memory cell array 110 through word lines WL0-WLm, string select lines SSL and ground select lines GSL. Address decoder 120 is configured to operate under the control of control logic 140. Address decoder 120 receives an address ADDR from an external source such as a host.

Address decoder 120 decodes a row address from the received address ADDR and selects a word line corresponding to the decoded row address among word lines WL0-WLm. Address decoder 120 also selects a string select line and a ground select line corresponding to the decoded row address among string select lines SSL and ground select lines GSL. Address decoder 120 also decodes a column address among the received address ADDR and transmits the decoded column address to read/write circuit 130. Address decoder 120 typically comprises a row decoder for decoding the row address, a column decoder for decoding the column address and an address buffer for storing the received address ADDR.

Read/write circuit 130 is coupled to memory cell array 110 through bit lines BL. Read/write circuit 130 is configured to exchange data DATA with an external device such as a host. Read/write circuit 130 operates under the control of control logic 140. Read/write circuit 130 receives a decoded column address DCA from address decoder 120. Read/write circuit 130 selects bit lines BL0-BLn in response to decoded column address DCA.

Read/write circuit 130 receives data DATA from an external source and writes the received data DATA in memory cell array 110. Read/write circuit 130 reads data DATA from memory cell array 110 and outputs read data DATA to an external destination.

Read/write circuit 130 typically comprises features such as a page buffer (or a page resistor), a column select circuit, and a data buffer. Read/write circuit 130 may further comprise features such as a sense amplifier, a write driver, a column select circuit, and a data buffer.

Control logic 140 is coupled to address decoder 120 and read/write circuit 130, and it controls general operations of nonvolatile memory device 100. Control logic 140 typically operates in response to a control signal CTRL received from an external source. Control signal CTRL typically comprises a command CMD, for example.

Voltage generator 150 operates under the control of control logic 140, and it generates various voltages used in nonvolatile memory device 100. For example, voltage generator 150 may generate high voltages used in nonvolatile memory device 100, and voltages to be provided to address decoder 120 and memory cell array 110.

Memory cell array 110 comprises a plurality of memory blocks, and each of the memory blocks comprises a plurality of sub blocks. An erase operation is performed on a sub block by sub block basis. Where one of the sub blocks is erased, a sub block adjacent to the erased sub block is reprogrammed. Thus, even if data in the adjacent sub block is affected by the erasure of the one sub block, the data in the adjacent sub block may be restored. This can improve the reliability of the nonvolatile memory device.

Figure 2:
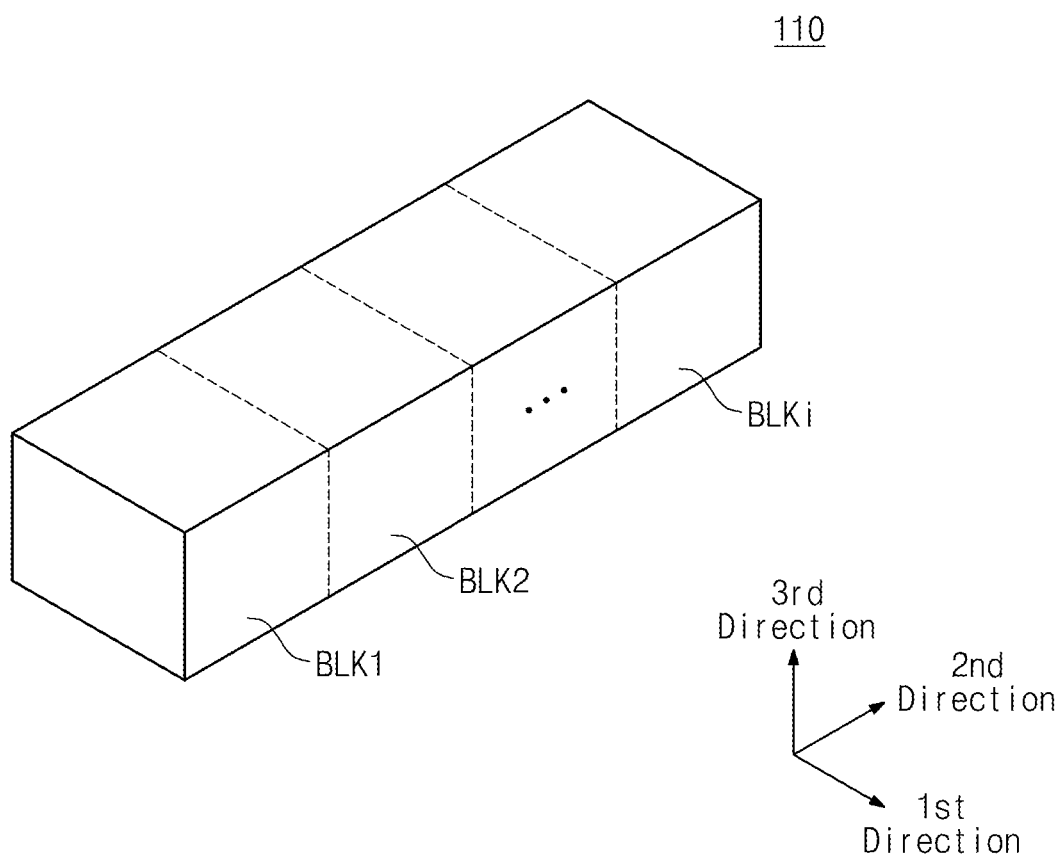
FIG. 2 is a block diagram illustrating a memory cell array of FIG. 1 according to an embodiment of the inventive concept.

FIG. 2 is a block diagram illustrating memory cell array 110 of FIG. 1 according to an embodiment of the inventive concept.

Referring to FIGS. 1 and 2, memory cell array 110 comprises a plurality of memory blocks BLK1-BLKi each having a 3D structure (or a vertical structure). Each memory block BLK comprises structures extending in first, second and third directions. Each memory block BLK comprises a plurality of cell strings extending in the second direction. Multiple cell strings are spaced apart from one another in the first and third directions.

Cell strings of each memory block BLK are connected to a plurality of bit lines BL, a plurality of string select lines SSL, a plurality of word lines WL, one or more ground select lines GSL, and a common source line. Cell strings of memory blocks BLK1-BLKi share a plurality of bit lines BL. For instance, bit lines BL extend in the second direction and are shared by memory blocks BLK1-BLKi.

Memory blocks BLK1-BLKi are selected by address decoder 120 of FIG. 1. Address decoder 120 selects a memory block corresponding to the received address ADDR among memory blocks BLK1-BLKi. Program, read and erase operations are performed on the selected memory block. Examples of memory blocks BLK1-BLKi are described in further detail with reference to FIGS. 3 through 6.

Figure 3:
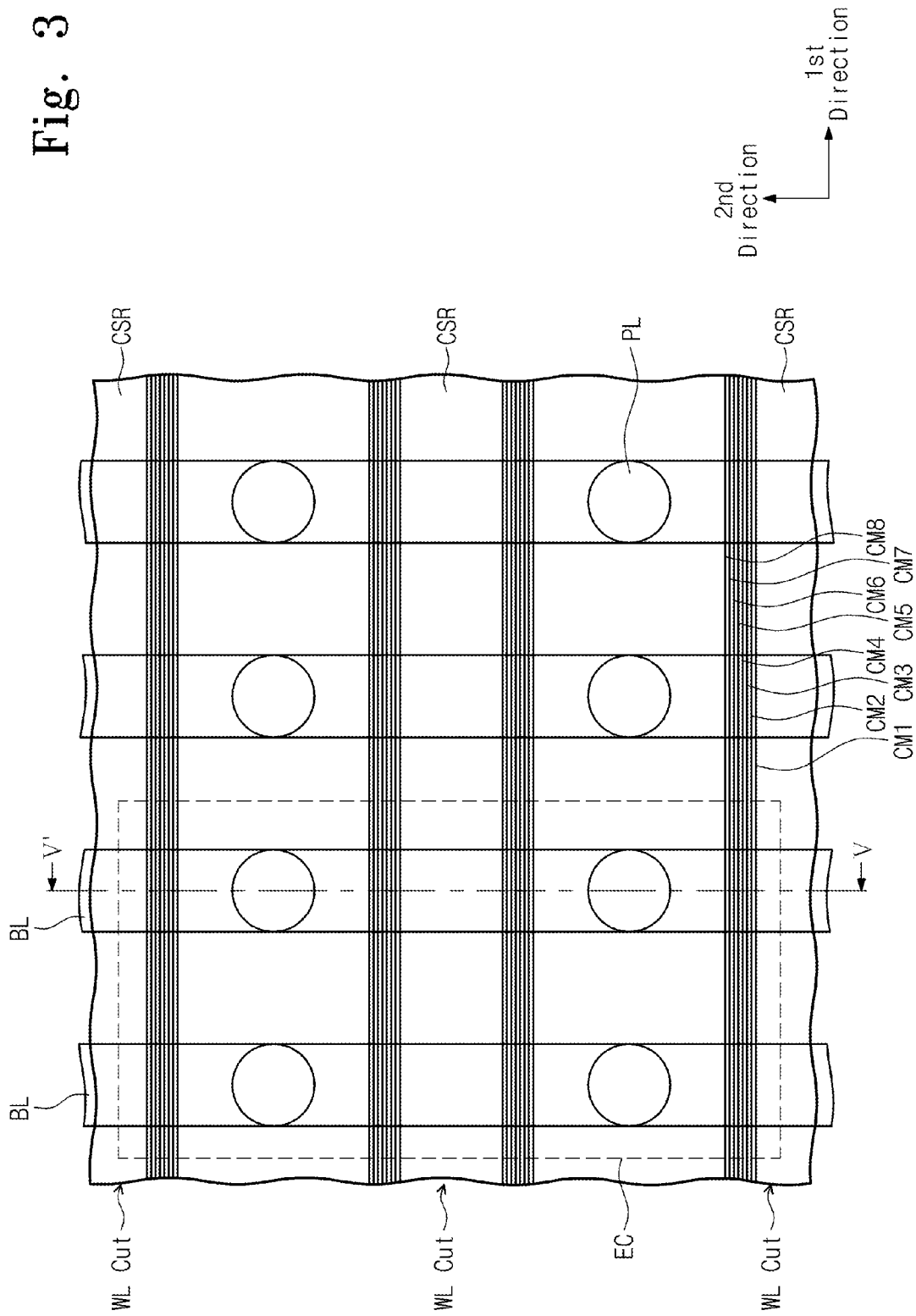
FIG. 3 is a top plan view illustrating a part of one memory block among memory blocks illustrated in FIG. 2 according to an embodiment of the inventive concept.
Figure 4:
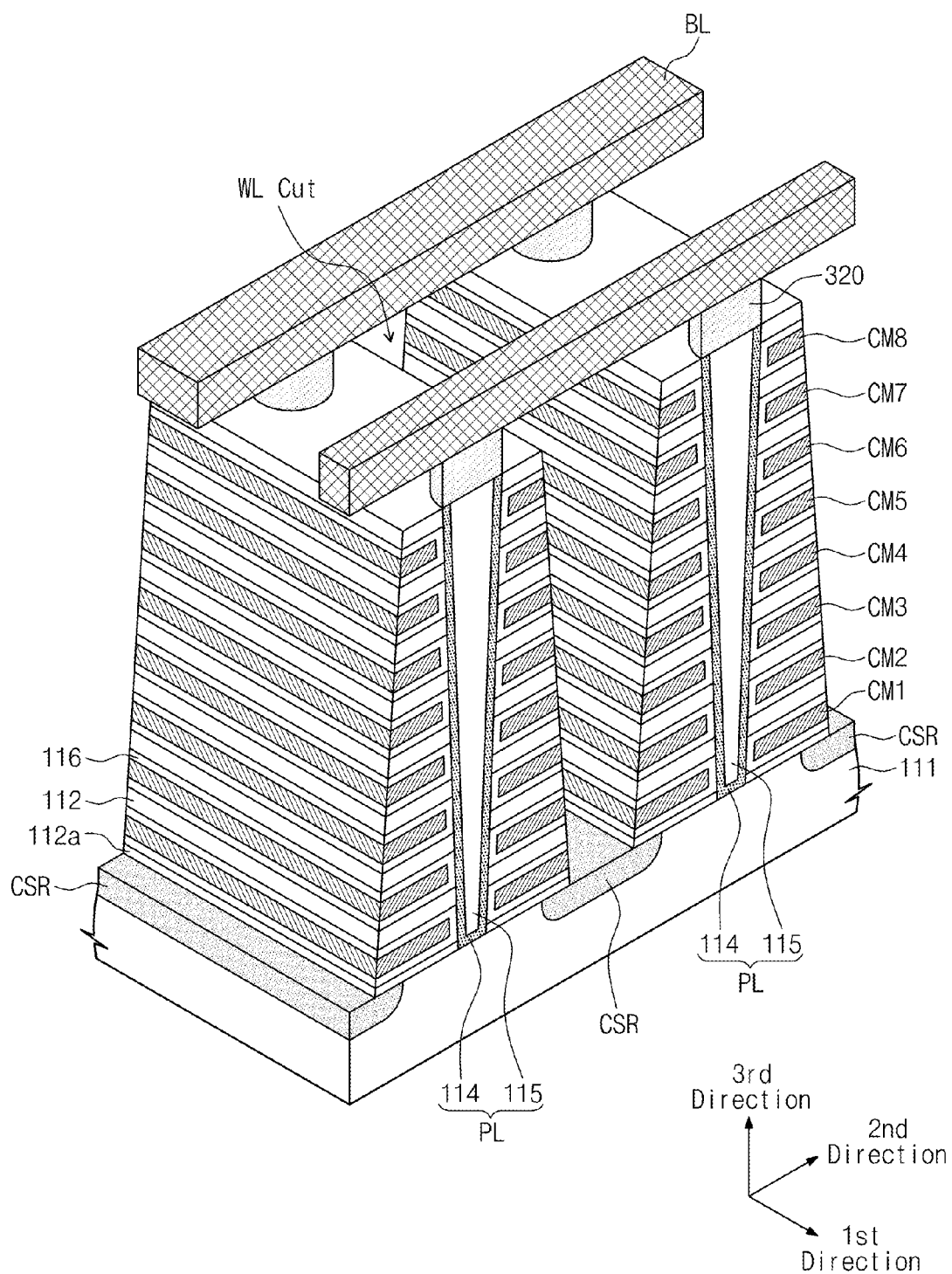
FIG. 4 is a perspective cross sectional view taken along the line V-V' of FIG. 3.

FIG. 3 is a top plan view illustrating a part of one memory block among memory blocks BLK of FIG. 2 according to an embodiment of the inventive concept. FIG. 4 is a perspective cross sectional view taken along a line V-V' of FIG. 3, and FIG. 5 is a cross sectional view taken along the line V-V' of FIG. 3.

Figure 5:
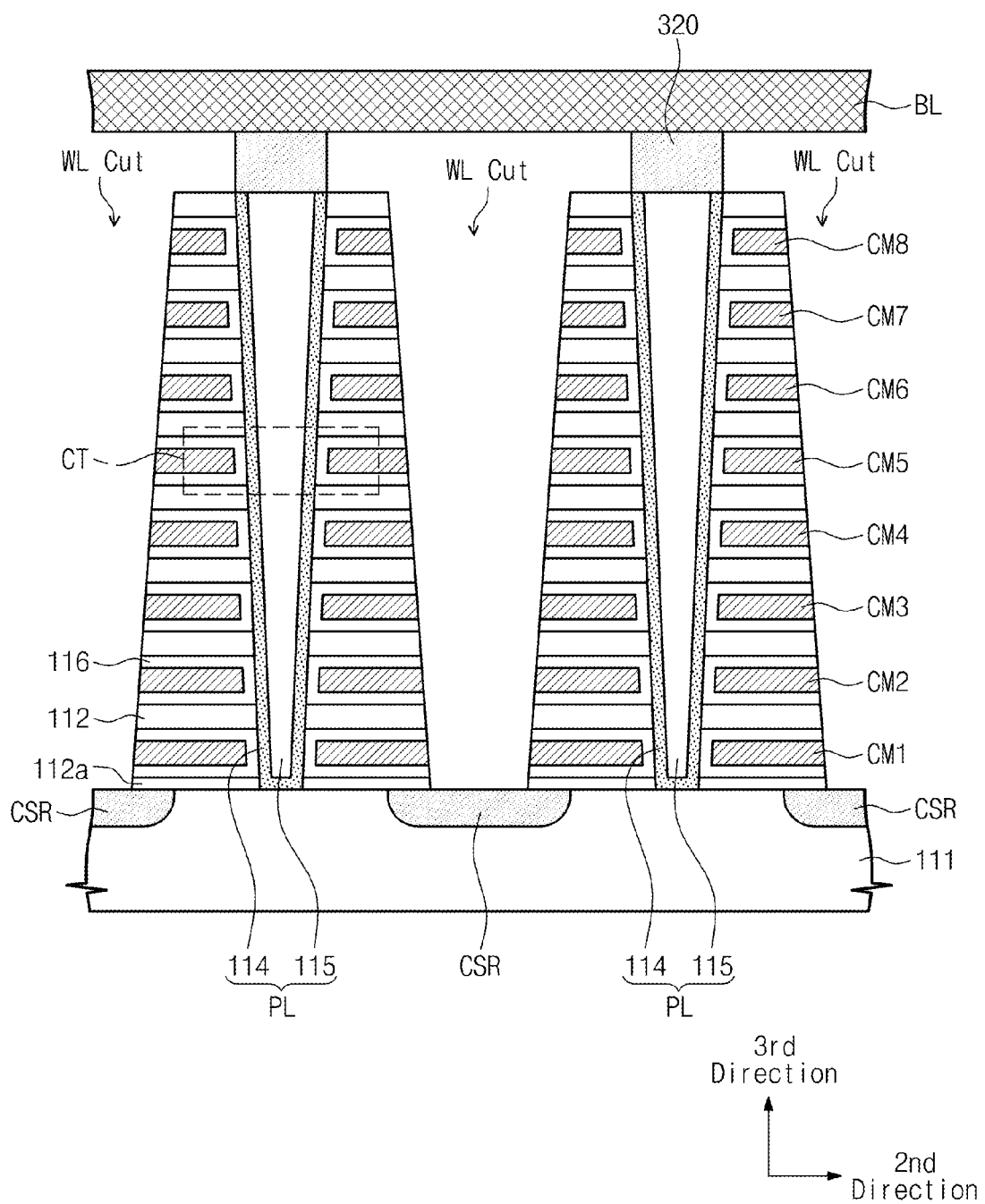
FIG. 5 is a cross sectional view taken along the line V-V' of FIG. 3.

Referring to FIGS. 3, 4 and 5, a 3D structure extends in the first, second and third directions. The 3D structure comprises a substrate 111. Substrate 111 typically comprises a well having a first conductivity type. For example, substrate 111 may comprise a p-well into which a third group element such as boron B is implanted. Moreover, substrate 111 may be a pocket p-well provided in an N-well. For explanation purposes, it will be assumed that substrate 111 is a p-well (or a pocket p-well). However, substrate 111 is not limited to this example.

A plurality of common source regions CSR is formed on substrate 111. Common source regions CSR extend in the first direction and are spaced apart from each another along the second direction. Common source regions CSR are connected to each other to form a common source line.

Common source regions CSR have a second conductivity type different from substrate 111. For example, in the following description it will be assumed that common source regions CSR have an N conductivity type. However, common source regions CSR are not limited to this example.

Insulating materials 112 and 112a are sequentially provided on substrate 111 between adjacent common source regions. Insulating materials 112 and 112a are formed along the third direction (i.e., a direction perpendicular to the substrate), they are spaced apart from one another along the third direction, and they extend in the first direction. Insulating materials 112 and 112a are typically formed of an insulating material such as a semiconductor oxide layer. A thickness of insulating material 112a contacting substrate 111 is smaller than a thickness of insulating material 112.

Pillars PL are formed between adjacent common source regions. Pillars PL are sequentially disposed along the first direction, and they penetrate insulating materials 112 and 112a along the third direction. Pillars PL penetrate insulating materials 112 and 112a to contact substrate 111. Between adjacent common source regions, pillars PL are spaced apart from one another along the first direction. Pillars PL may be disposed along the first direction in single file.

Pillars PL comprise channel films 114 and internal materials 115 formed inside channel films 114. Channel films 114 typically comprise a semiconductor material, e.g., silicon, having a first conductivity type. Channel films 114 typically comprise a semiconductor material, e.g., silicon, having the same conductivity type as substrate 111. Alternatively, channel films 114 may comprise an intrinsic semiconductor having no conductivity type. Internal materials 115 comprise an insulating material. Internal materials 115 typically comprise an insulating material such as a silicon oxide. In addition, they may comprise an air gap.

Data storage films 116 are formed on exposed surfaces of insulating materials 112 and 112a and pillars PL between adjacent common source regions. Data storage films 116 store data by capturing charges or discharging charges.

Conductive materials CM1-CM8 are formed on exposed surfaces of data storage films 116 between adjacent common source regions and between insulating materials 112 and 112a. Conductive materials CM1-CM8 extend along the first direction. At common source regions CSR, conductive materials CM1-CM8 are divided by word line cuts labeled "WL Cut". The word line cuts expose common source regions CSR, and they extend along the first direction. Conductive materials CM1-CM8 typically comprise a metallic conductive material. However, they may comprise a non-metallic conductive material such as polysilicon.

Data storage films 116 are removed from a top surface of the uppermost insulating material among insulating materials 112 and 112a. Data storage films 116 are also removed from a side surface facing pillars PL among side surfaces of insulating materials 112 and 112a.

Drains 320 are formed on pillars PL, and they extend to an upper portion of channel films 114 of pillars PL. Drains 320 are typically formed of a semiconductor material, e.g., silicon, having a second conductivity type. Drains 320 typically comprise a semiconductor material, e.g., silicon, having an N conductivity type. For explanation purposes, it will be assumed that drains 320 comprise N-type silicon. However, drains 320 are not limited to this example.

Bit lines BL are formed on drains 320. They extend in the second direction and are spaced apart from one another along the first direction. Bit lines BL are connected to drains 320. Drains 320 and bit lines BL are typically connected to each other through contact plugs. Bit lines BL typically comprise metallic conductive materials, but they may comprise non-metallic materials, e.g., polysilicon.

Conductive materials CM1-CM8 have first through eighth heights according to their distance from substrate 111. For example, conductive material CM1, which is adjacent to substrate 111, has a first height, and conductive material CM2, which is adjacent to conductive material CM1, has a second height.

Pillars PL form a plurality of cell strings together with data storage films 116 and conductive materials CM1-CM8. Each of pillars PL forms one cell string together with data storage films 116 and the adjacent conductive materials CM1-CM8.

Pillars PL are provided on substrate 111 along a row direction and a column direction. Eighth conductive materials CM8 constitute rows. Among conductive materials CM8, pillars connected to the same conductive material constitute one row. Bit lines BL constitute columns. Among bit lines BL, pillars connected to the same bit line constitute one column. Each of the cell strings comprises a plurality of cell transistors CT vertically stacked on substrate 111. A structure of cell transistor CT is described in further detail with reference to FIG. 6.

Figure 6:
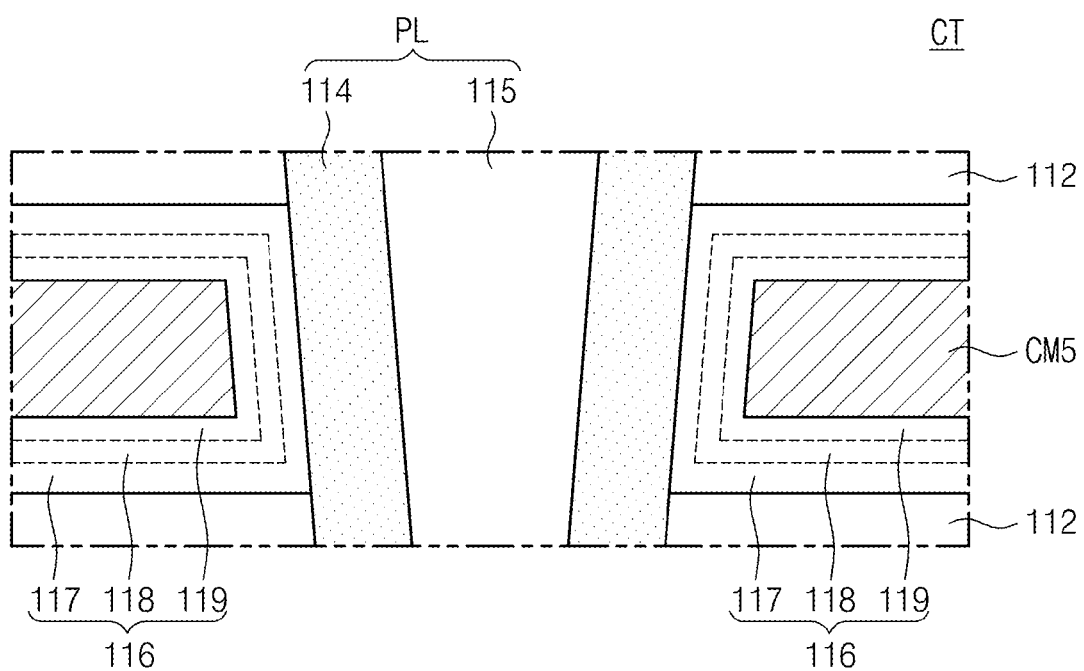
FIG. 6 is an enlarged view of a cell transistor illustrated in FIG. 5 according to an embodiment of the inventive concept.

FIG. 6 is an enlarged view of one of cell transistors CT illustrated in FIG. 5 according to an embodiment of the inventive concept.

Referring to FIGS. 3 through 6, cell transistors CT comprise conductive materials CM1-CM8, pillars PL and data storage films 116 formed between conductive materials CM1-CM8 and pillars PL.

Data storage films 116 extend from between conductive materials CM1-CM8 and pillars PL to top and bottom surfaces of conductive materials CM1-CM8. Data storage films 116 comprise first, second and third sub insulating films 117, 118 and 119.

In cell transistors CT, channel films 114 of pillars PL comprise p type silicon, i.e., the same conductivity type as substrate 111. Channel films 114 operate as a body of cell transistors CT. Channel films 114 are formed in a direction perpendicular to substrate 111, so they operate as a vertical body. Vertical channels are formed on channel films 114.

First sub insulating films 117, which are adjacent to pillars PL, operate as tunneling insulating films of cell transistors CT. First sub insulating films 117 comprises a thermal oxide film. First sub insulating films 117 comprises a silicon oxide film.

Second insulating films 118 operate as charge storage films of cell transistors CT. Second insulating films 118 operate as charge capturing films. Second insulating films 118 comprise a nitride film or a metal oxide film.

Third sub insulating films 119, which are adjacent to conductive materials CM1-CM8, operate as blocking insulating films of cell transistors CT. Third sub insulating films 119 can be formed as a single layer or a multi-layer. Third sub insulating films 119 typically comprise a high dielectric film (e.g., an aluminum oxide film or a hafnium oxide film) having a dielectric constant higher than first and second sub insulating films 117 and 118. Third sub insulating films 119 may comprise silicon oxide films, for example.

First, second and third sub insulating films 117-119 may form an ONA (oxide-nitride-aluminum oxide) or an ONO (oxide-nitride-oxide) structure, for example.

Conductive materials CM1-CM8 operate as gates (or control gates) of cell transistors CT. Accordingly, cell transistors CT may be formed by conductive materials CM1-CM8 operating as gates (or control gates), third sub insulating films 119 operating as blocking insulating films, second sub insulating films 118 operating as charge storage films, first sub insulating films 117 operating as tunneling insulating films, and channel films 114 operating as a vertical body. Cell transistor CT may be capturing cell transistors.

Cell transistors CT can be used for various alternative purposes according to their respective heights. For instance, cell transistors having respective heights provided to upper portions among cell transistors CT can be used as string select transistors. The string select transistors may perform switching between the cell strings and the bit lines. Cell transistors having respective heights at lower portions among cell transistors CT can be used as ground select transistors. The ground select transistors may perform a switching between the cell strings and a common source line formed of common source regions CSR. Cell transistors between the string select transistors and the ground select transistors can be used as memory cells and dummy memory cells.

Conductive materials CM1-CM8 extend along the first direction to combine with pillars PL. Conductive materials CM1-CM8 may constitute conductive lines connecting cell transistors CT of pillars PL to each other. Conductive materials CM1-CM8 may be used as string select lines SSL, ground select lines GSL, word lines WL, and dummy word lines DWL according to their respective heights.

Conductive materials connected to cell transistors used as string select transistors SST to each other may be used as string select lines SSL. Conductive materials connected to cell transistors used as ground select transistors GST to each other may be used as ground select lines GSL. Conductive materials connected to cell transistors used as memory cells may be used as word lines. Conductive materials connected to cell transistors used as dummy memory cells may be used as dummy word lines.

In the examples of FIGS. 4, 5 and 6, conductive materials CM1-CM8 are described in eight layers. However, the conductive materials are not limited to this number. For example, the conductive materials can be provided to at least eight layers forming memory cells and at least two layers forming select transistors. Alternatively, the conductive materials may be provided to at least sixteen layers forming memory cells and at least two layers forming select transistors. The conductive materials may be provided to a plurality of layers forming memory cells and at least two layers forming select transistors.

As illustrated in FIGS. 4, 5 and 6, a cross sectional area of pillar PL formed along the first direction and the third direction increases with distance from substrate 111. The cross sectional area of pillar PL formed along the first direction and the third direction tends to vary according to general tolerances or errors in manufacturing processes. Pillar PL is typically formed by providing a material such as a silicon material and an insulating material into a hole formed by an etching process. As a depth of the hole increases, a cross sectional area of the hole formed along the first direction and the third direction may be reduced. That is, the cross sectional area of pillar PL formed along the first direction and the third direction may be increased with the distance from substrate 111.

Figure 7:
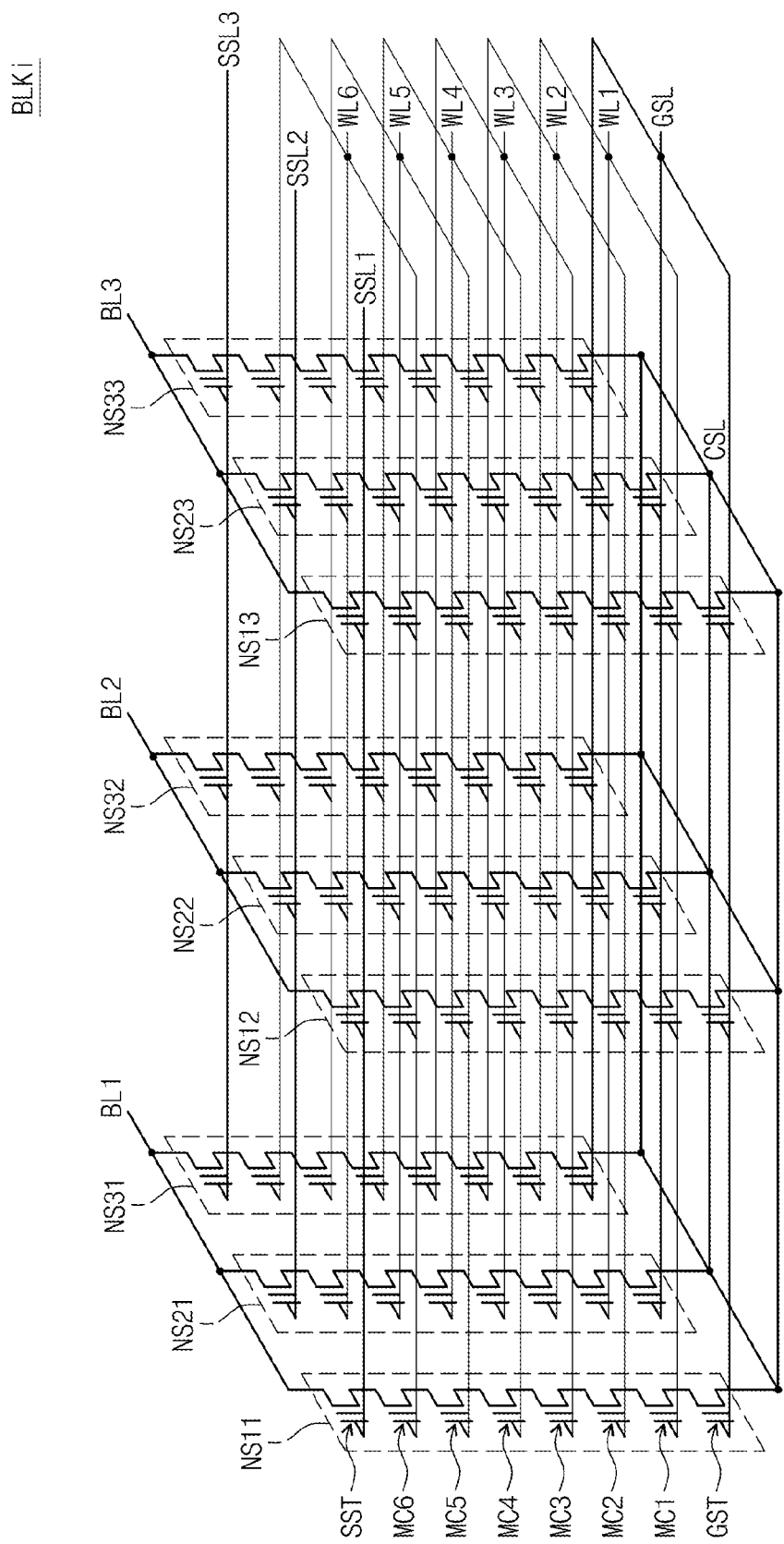
FIG. 7 is a circuit diagram of the memory block described with reference to FIGS. 3 through 6 according to an embodiment of the inventive concept.

FIG. 7 is a circuit diagram of the memory block described with reference to FIGS. 3 through 6 according to an embodiment of the inventive concept.

Referring to FIGS. 3 through 7, NAND strings NS11, NS21 and NS31 are formed between first bit line BL1 and common source line CSL. NAND strings NS12, NS22 and NS32 are formed between second bit line BL2 and common source line CSL. NAND strings NS13, NS23 and NS33 are formed between third bit line BL3 and common source line CSL.

In the embodiment of FIG. 7, three NAND strings NS are connected to respective bit lines BL1, BL2 and BL3. However, multiple NAND strings may be connected to one bit line BL.

A string select transistor SST of each NAND string NS is connected to the corresponding bit line. A ground select transistor GST of each NAND string NS is connected to common source line CSL. Memory cells MC are provided between string select transistor SST and ground select transistor GST of each NAND string NS.

In the description that follows, NAND strings NS are distinguished by rows and columns. NAND strings NS connected to one bit line form one column. For instance, NAND strings NS11, NS21 and NS31 connected to first bit line BL1 correspond to a first column. NAND strings NS12, NS22 and NS32 connected to second bit line BL2 correspond to a second column. NAND strings NS13, NS23 and NS33 connected to third bit line BL3 correspond to a third column.

NAND strings NS connected to one string select line SSL form one row. For instance, NAND strings NS11, NS12 and NS13 connected to a first string select line SSL1 form a first row. NAND strings NS21, NS22 and NS23 connected to a second string select line SSL2 form a second row. NAND strings NS31, NS32 and NS33 connected to a third string select line SSL3 form a third row.

Within a NAND string, different transistors are located at different heights. For convenience, these heights will be designated with numbers as follows, where a higher number indicates a greater height. For example, in each NAND string NS, ground select transistor GST is designated with height 1. Memory cell MC1 adjacent to ground select transistor GST is designated with height 2. String select transistor SST is designated with height 8. Memory cell MC6 adjacent to string select transistor SST is designated with height 7, and so on. As the order of memory cells MC increases from ground select transistor GST to string select transistor SST, the height of the memory cells MC increases. For instance, first, second and third memory cells MC1, MC2 and MC3 are designated with respective heights 2, 3 and 4. Fourth, fifth and sixth memory cells MC4, MC5 and MC6 designated with heights 5, 6 and 7, respectively.

NAND strings NS of the same row share ground select line GSL. NAND strings NS of different rows also share ground select line GSL. Conductive materials (e.g., CM1 of FIGS. 4 and 5) having height 1 are connected to each other to form ground select line GSL.

Memory cells MC of same height in NAND strings NS of the same row share a word line WL. Word lines WL having the same height in NAND strings NS of different rows are connected to each other. That is, memory cells MC having the same height share a word line WL. Conductive materials (e.g., CM2 of FIGS. 4 and 5) having height 2 are connected to each other to form a first word line WL1. Conductive materials (e.g., CM3 of FIGS. 4 and 5) having height 3 are connected to each other to form a second word line WL2. Conductive materials (CM4 of FIGS. 4 and 5) having height 4 are connected to each other to form a third word line WL3. Conductive materials (e.g., CM5 of FIGS. 4 and 5) having height 5 are connected to each other to form a fourth word line WL4. Conductive materials (e.g., CM6 of FIGS. 4 and 5) having height 6 are connected to each other to form a fifth word line WL5. Conductive materials (e.g., CM7 of FIGS. 4 and 5) having height 7 are connected to each other to form a sixth word line WL6.

NAND strings NS of the same row share string select line SSL. NAND strings NS of different rows are connected to different string select lines SSL1, SSL2 and SSL3 respectively. First, second and third string select lines SSL1, SSL2 and SSL3 correspond to conductive materials having height 8 (e.g., CM8 of FIGS. 4 and 5) respectively.

In the description that follows, first string select transistors SST1 are considered to be string select transistors SST connected to the first string select line SSL1. Second string select transistors SST2 are considered to be string select transistors SST connected to the second string select line SSL2. Third string select transistors SST3 are considered to be string select transistors SST connected to the third string select line SSL3.

Common source line CSL is connected to NAND strings NS in common. A plurality of common source regions CSR is connected to each other to form common source line CSL.

As illustrated in FIG. 7, word lines WL having the same height are connected in common. Thus, when a word line WL having a specific height is selected, all NAND strings NS connected to the selected word line WL are selected.

NAND strings NS of different rows are connected to different string select lines SSL respectively. By selecting or unselecting string select lines SSL1, SSL2 and SSL3, among NAND strings NS connected to the same word line WL, NAND strings NS of unselected rows may be electrically separated from the corresponding bit line and NAND strings NS of selected row may be electrically connected to the corresponding bit line.

That is, by selecting or unselecting string select lines SSL1, SSL2 and SSL3, a row of NAND strings NS may be selected. By selecting bit lines BL1, BL2 and BL2, a column of NAND stings NS of selected row may be selected.

Where a program operation and a read operation are performed, one of sting select lines SSL1, SSL2 and SSL3 is selected. That is, a program operation and a read operation are performed by a row unit of the NAND strings (e.g., NAND strings NS11-NS13, NS21-NS23 and NS31-NS33).

Where a program operation and a read operation are performed, a select voltage is applied to a selected word line of the selected row and an unselect voltage is applied to unselected word lines. The select voltage can be, for instance, a program voltage Vpgm or a select read voltage Vrd. The unselect voltage can be, for example, a pass voltage Vpass or an unselect read voltage Vread. That is, the program operation and the read operation may be performed by a word line unit of selected row of the NAND strings (e.g., NAND strings NS11-NS13, NS21-NS23 and NS31-NS33).

Figure 8:
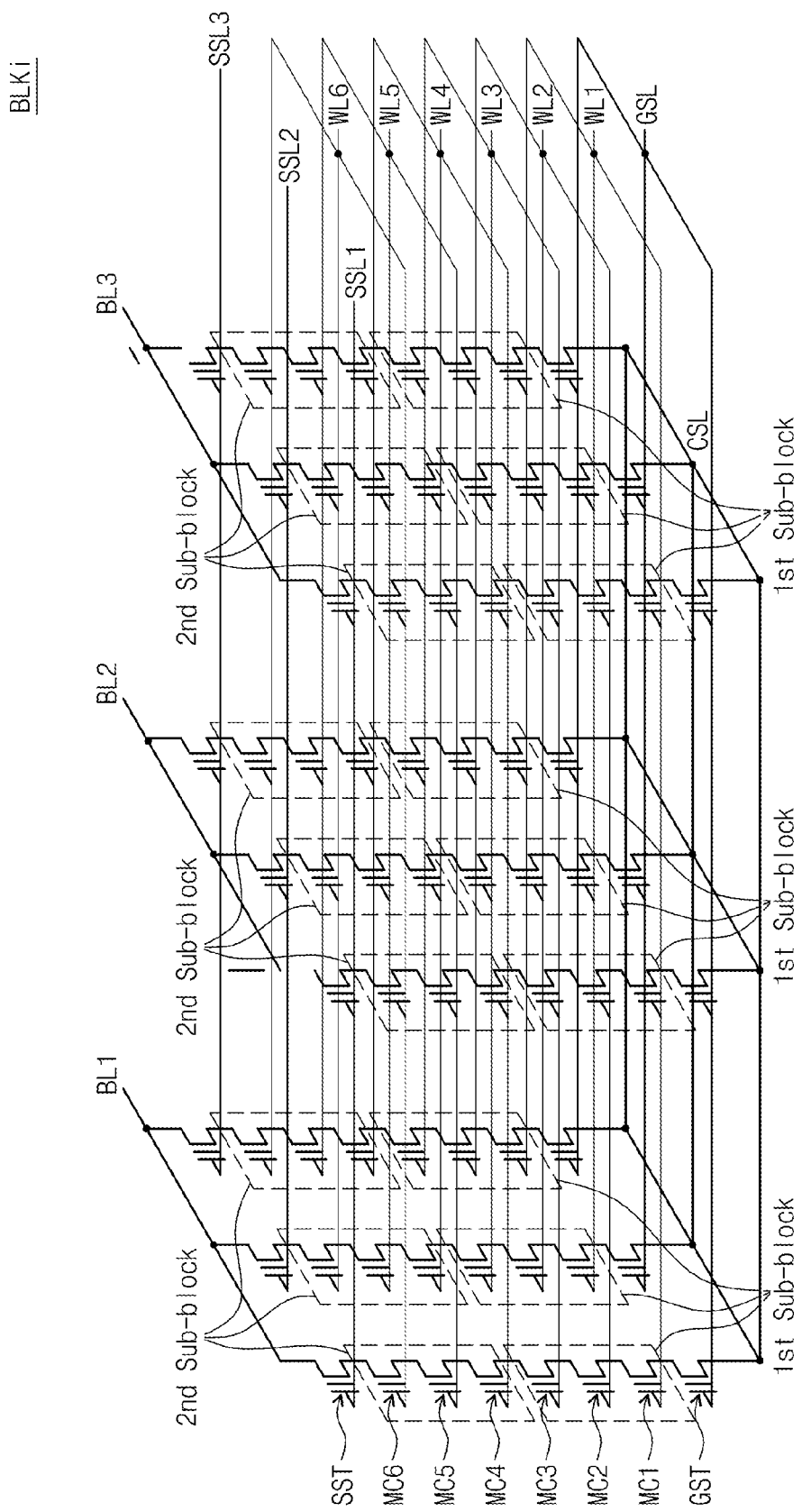
FIG. 8 is a circuit diagram illustrating sub blocks formed by memory cells in the memory block of FIG. 7 according to an embodiment of the inventive concept.

FIG. 8 is a circuit diagram illustrating sub blocks formed by memory cells in the memory block BLKi of FIG. 7 according to an embodiment of the inventive concept.

Referring to FIG. 8, in memory block BLKi, memory cells MC1-MC3 adjacent to ground select transistors GST constitute a first sub block. Memory cells MC4-MC6 adjacent to string select transistors SST constitute a second sub block. Accordingly, memory block BLKi comprises multiple sub blocks. In this example, sub blocks are considered to be memory blocks sharing respective ground select transistors GST and respective string select transistors SST.

An erase operation is performed on a sub block by sub block basis. In other words, it is performed on the basis of a sub block unit. Moreover, each sub block can be erased independently. While the first sub block is erased, the second sub block is erase-inhibited. While the second sub block is erased, the first sub block is erase-inhibited. That is, in each NAND string NS, while one part (e.g., MC1-MC3) of memory cells MC1-MC6 is erased, the other part (e.g., MC4-MC6) may be erase-inhibited. While one part (e.g., MC4-MC6) of memory cells MC1-MC6 is erased, the other part (e.g., MC1-MC3) may be erase-inhibited.

FIG. 9 is a table illustrating voltage conditions applied to memory block BLKi of FIG. 8 when an erase operation is performed on a nonvolatile memory device according to an embodiment of the inventive concept.

Referring to FIGS. 8 and 9, in an erase operation, string select lines SSL1-SSL3 are floated, word lines of unselected sub block are floated, a word line erase voltage Vwe is applied to word lines WL of the selected sub block, and ground select line GSL is floated. Meanwhile, an erase voltage Vers is applied to the substrate (e.g., substrate 111 of FIGS. 4 and 5).

Assuming that the first sub block is selected to be an erase block, where an erase operation is performed, word line erase voltage Vwe is applied to word lines WL1-WL3 of the selected first sub block. Where an erase operation is performed, word lines WL4-WL6 of the unselected second sub block are floated.

Figure 10:
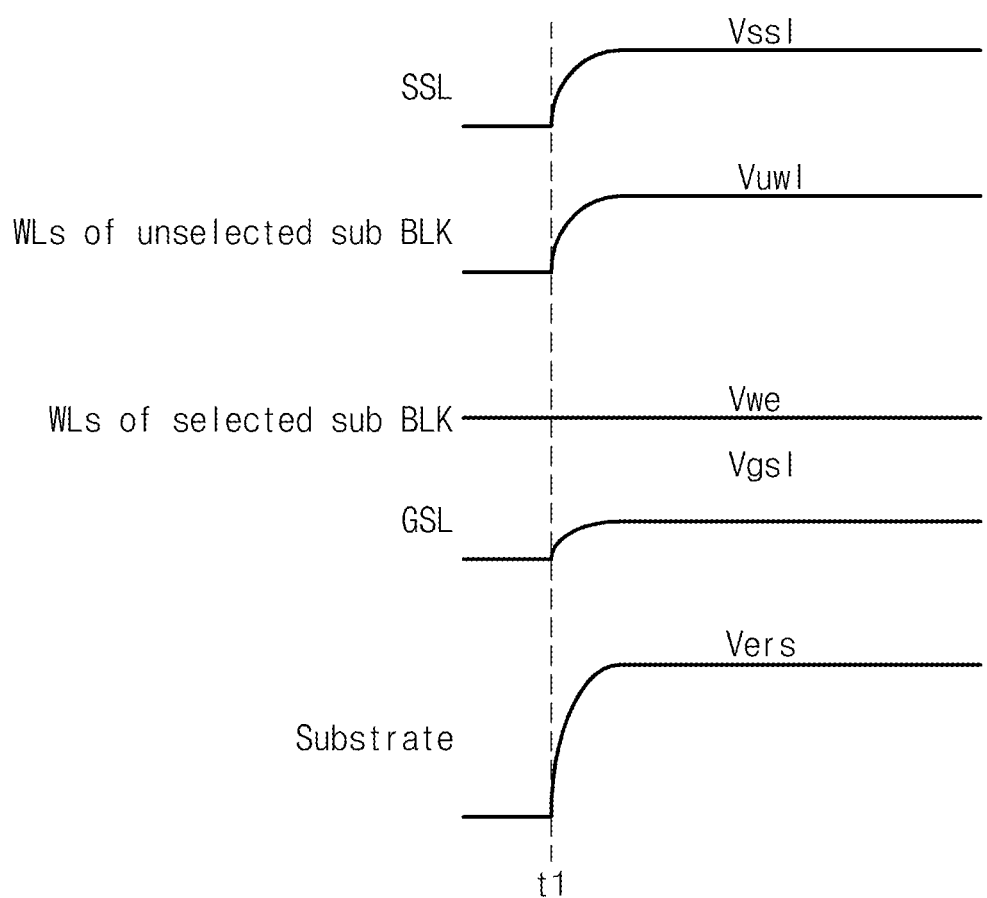
FIG. 10 is a timing diagram illustrating a voltage change of the memory block based on the voltage conditions of FIG. 9 according to an embodiment of the inventive concept.
Figure 11:
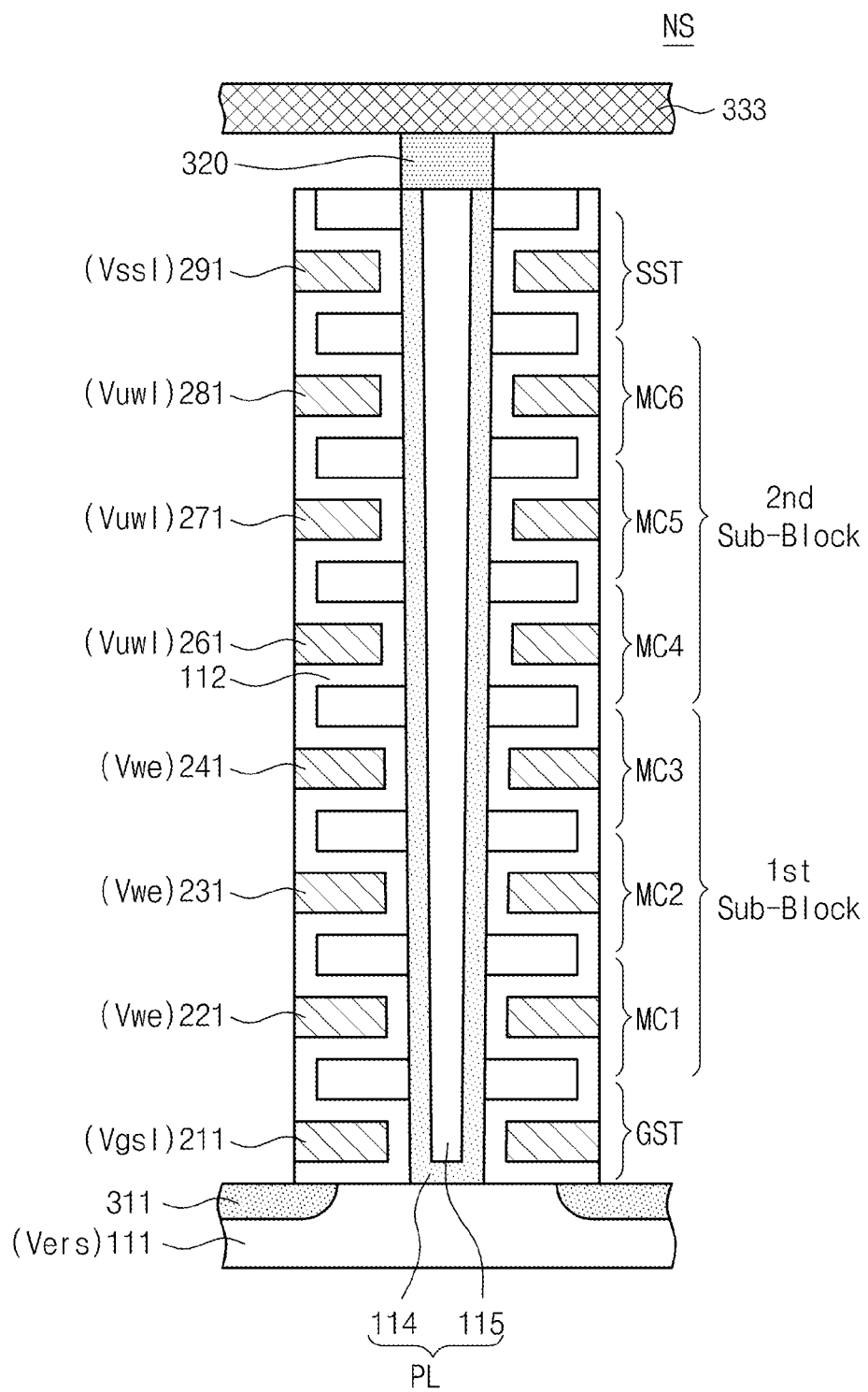
FIG. 11 is a cross sectional view of a NAND string of memory block according to an embodiment of the inventive concept.

FIG. 10 is a timing diagram illustrating a voltage change of memory block BLKi based on the voltage conditions shown in FIG. 9 according to an embodiment of the inventive concept. FIG. 11 is a cross sectional view of one NAND string NS of memory block BLKi. An erase operation of memory block BLKi is described with reference to the cross sectional view of one NAND string NS. It is assumed that the first sub block is erased and the second sub block is erase-inhibited.

Referring to FIGS. 8 through 11, at a time t1, erase voltage Vers is applied to substrate 111. Erase voltage Vers is a high voltage. Substrate 111 is doped with the same type as surface layer 114, so erase voltage Vers is transmitted to surface layer 114 of NAND string NS.

A conductive material 211 having height 1 operates as ground select line GSL and a gate (or control gate) of ground select transistor GST. At time t1, ground select line GSL is floated. Conductive material 211 undergoes a coupling influence from surface layer 114. Thus, as a voltage of surface layer 114 rises to erase voltage Vers, a voltage of conductive material 211 operating as ground select line GSL rises. A voltage of ground select line GSL rises to a ground select line voltage Vgsl.

Surface layer 114 operating as a body of the second direction receives erase voltage Vers. Conductive material 211 operating as a gate (or control gate) of ground select transistor GST receives ground select line voltage Vgsl. A difference between erase voltage Vers and the ground select line voltage Vgsl is insufficient to cause F—N tunneling. Thus, ground select transistor GST is erase-inhibited.

Conductive materials 221, 231 and 241 having respective heights 2, 3 and 4 operate as respective first, second and third word lines WL1, WL2 and WL3 and operate as respective gates of first, second and third memory cells MC1, MC2 and MC3. At time t1, a word line erase voltage Vwe is applied to selected word lines. Thus, word line erase voltage Vwe is applied to the first, second and third word lines WL1, WL2 and WL3. Word line erase voltage Vwe may be a low voltage. For example, the word line erase voltage may be a ground voltage.

Surface layer 114 operating as the body of the second direction receives erase voltage Vers, and conductive materials 221, 231 and 241 operating as gates (or control gates) of the first, second and third memory cells MC1, MC2 and MC3 receive word line erase voltage Vwe. A difference between erase voltage Vers and word line erase voltage Vwe causes F—N tunneling. Levels of erase voltage Vers and word line erase voltage Vwe are set so that F—N tunneling occurs. The first, second and third memory cells MC1, MC2 and MC3 of the first sub block are erased.

Conductive materials 261, 271 and 281 having heights 5, 6, and 7 operate as fourth, fifth and sixth word lines WL4, WL5 and WL6 respectively and gates (or control gates) of the fourth, fifth and sixth memory cells MC4, MC5 and MC6. At time t1, unselected word lines are floated. Conductive materials 261, 271 and 281 undergo a coupling influence from surface layer 114. Thus, as a voltage of surface layer 114 rises to erase voltage Vers, voltages of conductive materials 261, 271 and 281 operating as the fourth, fifth and sixth word lines WL4, WL5 and WL6 rise. Voltages of the fourth, fifth and sixth word lines WL4, WL5 and WL6 rise to an unselect word line voltage Vuwl.

Surface layer 114 operating as a body of the second direction receives erase voltage Vers, and conductive materials 261, 271 and 281 operating as gates (or control gates) of the fourth, fifth and sixth memory cells MC4, MC5 and MC6 receive unselect word line voltage Vuwl. A difference between erase voltage Vers and unselect word line voltage Vuwl is insufficient to cause F—N tunneling. Thus, the fourth, fifth and sixth memory cells MC4, MC5 and MC6 of the unselected second sub block are erase-inhibited.

A conductive material 291 having height 8 operates as string select line SSL and operates as a gate (or a control gate) of string select transistor SST. At time t1, the string select line is floated. Conductive material 291 experiences a coupling influence from surface layer 114. Thus, as a voltage of surface layer 114 rises to erase voltage Vers, a voltage of conductive material 291 operating as string select line SSL rises. A voltage of string select line SSL rises to a string select line voltage Vssl.

Surface layer 114 operating as the body of the second direction receives erase voltage Vers and conductive material 291 operating as a gate (or a control gate) of string select transistor SST receives string select line voltage Vssl. A difference between erase voltage Vers and string select line voltage Vssl is insufficient to cause F—N tunneling. Thus, string select transistor SST is erase-inhibited.

Where a word line erase voltage Vwe is applied to word lines (e.g., WL1~WL3) of the selected sub block (e.g., the first sub block), voltages of the word lines (WL4~WL6) of unselected sub block (i.e., the second sub block) rise to an unselected word line voltage Vuwl due to a coupling phenomenon. At this time, the word lines (WL4~WL6) of unselected sub block may be coupling-affected by word line erase voltage Vwe applied to word lines WL1~WL3 of the selected sub block.

A coupling effect from word lines WL1~WL3 of the selected sub block reduces a voltage rising width of word lines WL4~WL6 of the unselected sub block. That is, word lines WL4~WL6 of the unselected sub block may not sufficiently rise to unselect word line voltage Vuwl due to the coupling effect from word lines WL1~WL3 of the selected sub block. This may cause an error in data stored in memory cells MC4~MC6 of the unselected sub block. For example, a distribution of threshold voltages of memory cells MC4~MC6 of the unselected sub block may be changed. However, by reprogramming the unselected sub block after an erase operation of the selected sub block, the changed distribution of threshold voltage of the unselected sub block can be restored. An example of the reprogram operation of the unselected sub block performed after an erase operation of the selected sub block will be described in with reference to FIGS. 12 through 15.

Figure 12:
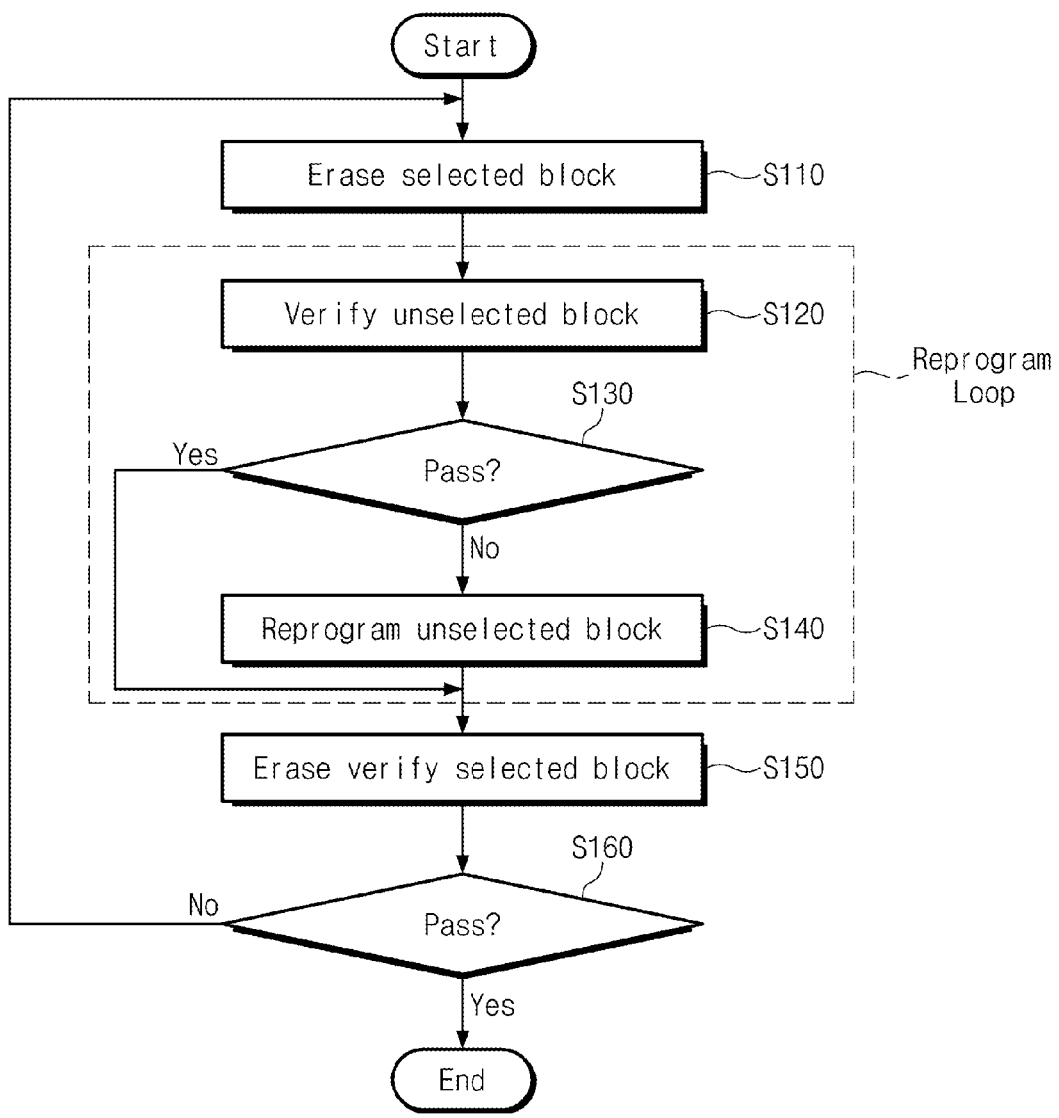
FIG. 12 is a flow chart illustrating an erase operation of a nonvolatile memory device according to an embodiment of the inventive concept.
Figure 13:
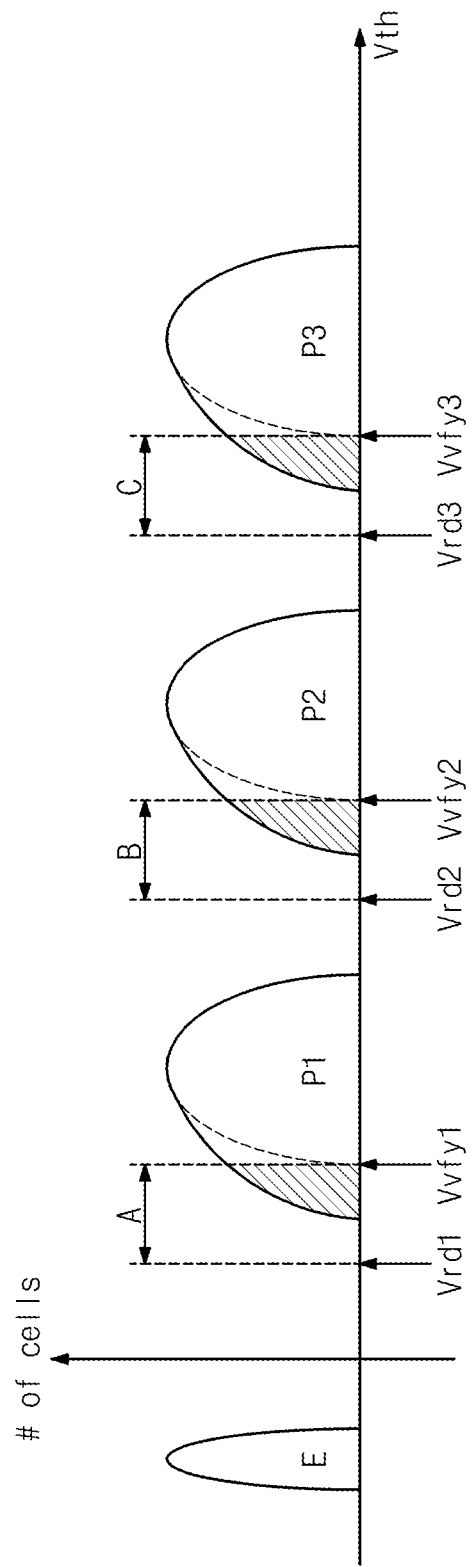
FIG. 13 is a diagram for describing a reprogram operation of an unselected sub block in the nonvolatile memory device of FIG. 12 according to an embodiment of the inventive concept.

FIG. 12 is a flow chart illustrating an erase operation of nonvolatile memory device according to an embodiment of the inventive concept. FIG. 13 is a diagram for describing a reprogram operation of an unselected sub block of FIG. 12 according to an embodiment of the inventive concept. The erase operation of FIG. 12 will be described with reference to memory block BLKi of FIG. 8, and it will be assumed that the first sub block is erased and the second sub block is erase-inhibited. In the description that follows, example method steps will be indicated by parentheses (SXXX).

Referring to FIGS. 8, 10, 12, and 13, the selected sub block (i.e., the first sub block) is erased (S110). As described above, when performing an erase operation, string select lines SSL1~SSL3 are floated. Word lines WL4~WL6 of the unselected sub block (i.e., the second sub block) are floated. Erase voltage Vwe is applied to word lines WL1~WL3 of the selected sub block. Ground select line GSL is floated. Erase voltage Vers is applied to the substrate. Under these conditions, the selected sub block is erased.

While the selected sub block is erased, word lines WL4~WL6 of the unselected sub block are coupling-affected by word line erase voltage Vwe applied to word lines WL1~WL3 of the selected sub block. In particular, among word lines WL4~WL6 of the unselected sub block, the word lines near the selected sub block are more coupling-affected. For example, word line WL4 of the unselected sub block is more coupling-affected than word lines WL5~WL6 of the unselected sub block.

Due to the coupling effect, as illustrated in FIG. 13, a distribution of threshold voltages of memory cells MC4~MC6 of the unselected sub block is changed. Word lines WL4~WL6 of the unselected sub block coupling-affected by the word line erase voltage Vew applied to word lines WL1~WL3 of the selected sub block cannot sufficiently rise to unselected word line voltage Vuwl. As a result, the distribution of threshold voltages of memory cells MC4~MC6 of the unselected sub block is changed by an effect of erase voltage Vers. For example, as indicated by areas A, B and C in which an oblique line is drawn, a distribution of threshold voltages of memory cells MC4~MC6 of the unselected sub block programmed in normal program states P1, P2 and P3 may be lowered.

The unselected sub block coupling-affected when performing an erase operation of the selected sub block is reprogrammed through a reprogram loop (S120, S130 and S140). The reprogram operation is performed on one or more word lines among word lines WL4~WL6 of the unselected sub block. In the reprogram loop in accordance with some embodiments of the inventive concept, the reprogram operation is to apply a program pulse to the unselected sub block without data input from the outside (e.g., a memory controller).

For explanation purposes, it will be assumed that among word lines WL4~WL6 of the unselected sub block, word line WL4 most adjacent to the selected sub block is most coupling-affected. According to the assumption, a reprogram operation of word line WL4 of the unselected sub block is described as an illustration.

In the reprogram loop, program states of memory cells MC4 of word line WL4 are verified (S120). That is, if referring to FIG. 13, the program states of memory cells MC4 of word line WL4 are verified respectively using select read voltages Vrd1~Vrd3 and program verification voltages Vvfy1~Vvf3.

Next, it is distinguished whether memory cells MC4 of word line WL4 are reprogrammed (S130). Where a threshold voltage of at least one of memory cells MC4 is determined to be in the area (i.e., area A, B or C) which is higher than select read voltage Vrd and lower than program verification voltage Vvfy (S130=No), the verification operation is considered to be failed and the erase operation proceeds to step S140. Where threshold voltages of memory cells MC4 are determined to be unchanged (S130=Yes), the verification operation is considered to be passed and the erase operation proceeds to step S150.

Through steps S120 and the S130, it is determined whether program states of memory cells MC4 are changed by a coupling effect. Thereafter, a reprogram operation is performed on the memory cells of which program states are changed by the coupling effect (S140).

Where a reprogram operation of the unselected sub block is completed which is coupling-affected when an erase operation of the selected sub block is performed, an erase verification operation is performed on the selected sub block (S150). Then, a result of the erase verification operation of the selected sub block is determined (S160). Where the selected sub block is determined to be erased (S160=Yes), the erase operation ends. Otherwise, where the selected sub block is determined to be not erased (S160=No), the erase operation returns to step S110.

In the erase operation of FIG. 12, the reprogram operation (i.e., the reprogram loop) of the unselected sub block is described to be performed between the erase operation of the selected sub block and the erase verification operation of the unselected sub block. However, the reprogram operation of the unselected sub block may be performed after the erase operation of the selected sub block and the erase verification operation of the unselected sub block are completed. For example, where an erase operation is performed using an incremental step pulse erase (ISPE) method, the erase operation and the erase verification operation constitute one erasure loop and whenever the erasure loop is repeated, erase voltage Vers is increased and the erase operation is performed with the increased erase voltage Vers. In this case, the reprogram operation of the unselected sub block may be performed after the erasure loops are completed.

Figure 14:
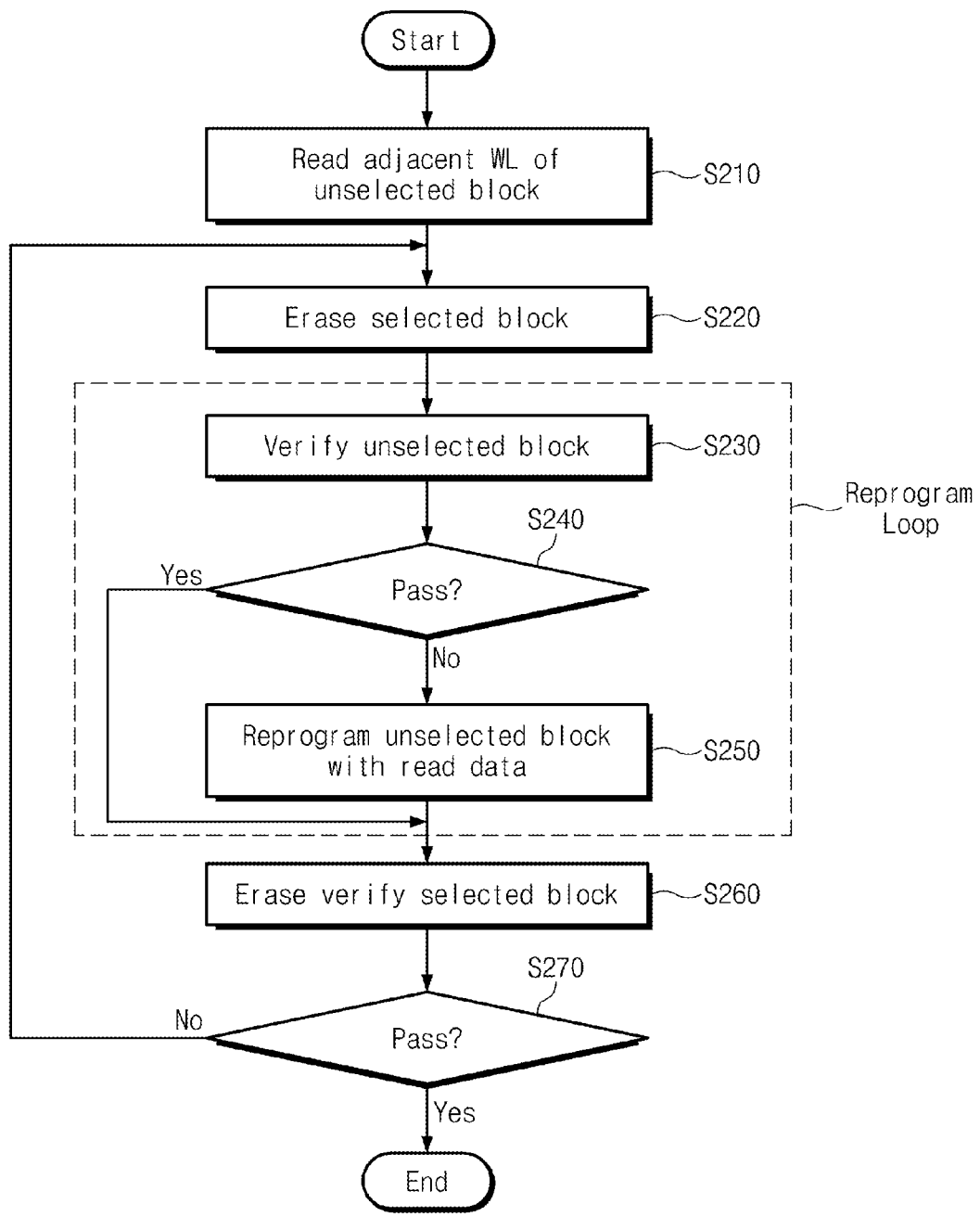
FIG. 14 is a flow chart illustrating an erase operation of nonvolatile memory device according to an embodiment of the inventive concept.
Figure 15:
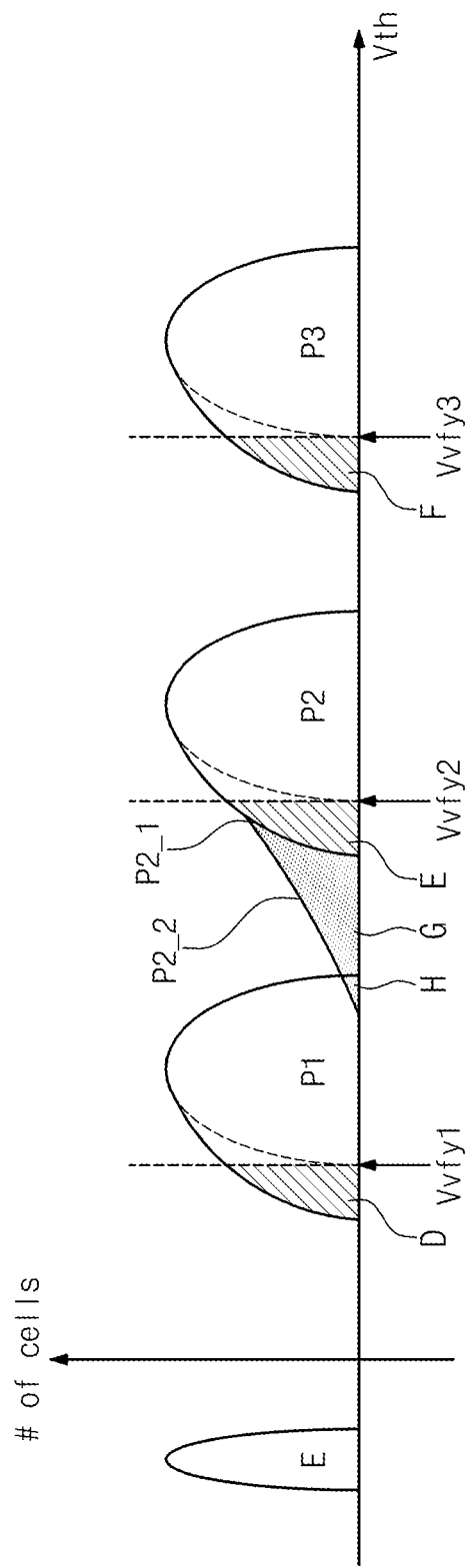
FIG. 15 is a drawing for describing a reprogram operation of an unselected sub block in the nonvolatile memory device of FIG. 14 according to an embodiment of the inventive concept.

FIG. 14 is a flow chart illustrating an erase operation of nonvolatile memory device according to an embodiment of the inventive concept. FIG. 15 is a drawing for describing a reprogram operation of an unselected sub block of FIG. 14 according to an embodiment of the inventive concept. An erase operation of memory block BLKi is described with reference to FIGS. 8, 10, 14 and 15. It is assumed that the first sub block is erased and the second sub block is erase-inhibited.

Referring to FIG. 14, data is read from memory cells connected to one or more word line adjacent to the selected sub block (i.e., the first sub block) among word lines WL4~WL6 of the unselected sub block (i.e., the second sub block) (S210). The read data is temporarily stored in read/write circuit 130 of FIG. 1 until a reprogram operation is completed. The read data is output to an external destination (e.g., a memory controller) of a nonvolatile memory device to be stored therein.

Data read from the unselected sub block is then backed up for a subsequent reprogram operation, and an erase operation is performed on the selected sub block (S220). As described above, in the erase operation, string select lines SSL1~SSL3 are floated, word lines WL4~WL6 of the unselected sub block (i.e., the second sub block) are floated, and a word line erase voltage Vwe is applied to word lines WL1~WL3 of the selected sub block. In addition, ground select line GSL is floated and erase voltage Vers is applied to the substrate. Under these conditions, the selected sub block is erased.

While the selected sub block is erased, word lines WL4~WL6 of the unselected sub block may be coupling-affected by word line erase voltage Vwe applied to word lines WL1~WL3 of the selected sub block. In particular, among word lines WL4~WL6 of the unselected sub block, the word lines near the selected sub block may be more coupling-affected. For example, word line WL4 of the unselected sub block may be more coupling-affected than word lines WL5~WL6 of the unselected sub block.

Based on the coupling effect, as illustrated in FIG. 15, a distribution of threshold voltages of memory cells MC4~MC6 of the unselected sub block may change. Word lines WL4~WL6 of the unselected sub block coupling-affected by the word line erase voltage Vew applied to word lines WL1~WL3 of the selected sub block cannot sufficiently rise to unselected word line voltage Vuwl. As a result, the distribution of threshold voltages of memory cells MC4~MC6 of the unselected sub block may be changed by an effect of erase voltage Vers. For example, as indicated by areas D, E, F and G in which an oblique line is drawn, a distribution of threshold voltages of memory cells MC4~MC6 of the unselected sub block programmed in normal program states P1, P2 and P3 may be lowered.

The unselected sub block that is coupling-affected in the erase operation of the selected sub block is reprogrammed through a reprogram loop (S230, S240, and S250). The reprogram operation can be performed on one or more word lines among word lines WL4~WL6 of the unselected sub block. In some embodiments, the reprogram operation applies a program pulse to the unselected sub block without data input from an external source (e.g., a memory controller).

For explanation purposes, it will be assumed that among word lines WL4~WL6 of the unselected sub block, word line WL4 is most coupling-affected. Based on this assumption, a reprogram operation of word line WL4 of the unselected sub block is described as an illustration.

In the reprogram operation of word line WL4, program states of memory cells MC4 of word line WL4 are verified (S230). That is, program states P1, P2 and P3 of memory cells MC4 of word line WL4 are verified respectively using program verification voltages Vvfy1~Vvf3. Next, it is determined whether memory cells MC4 of word line WL4 are reprogrammed (S240). Where a threshold voltage of at least one of memory cells MC4 is determined to be in an area which is lower than program verification voltage Vvfy (e.g., one of areas D, E, F or G) (S240=No), the verification operation is considered to be failed and the erase operation proceeds to step S250. Where threshold voltages of memory cells MC4 are determined to be unchanged (S240=Yes), the verification operation is considered to be passed and the erase operation proceeds to step S260.

In the reprogram operation, memory cells of the unselected sub block that are coupling-affected while the selected sub block is erased are reprogrammed using backed up data (S250). In other words, the memory cells are reprogrammed using the data read in step S210.

Following the reprogram loop, an erase verification operation is performed on the selected sub block (S260). Thereafter, a result of the erase verification operation is determined (S270). If the selected sub block is determined to be successfully erased (S270=Yes), the erase operation ends. Otherwise, the selected sub block is determined to be not successfully erased (S270=No), the erase operation returns to step S220.

In the embodiment of FIG. 14, the reprogram loop of the unselected sub block is described to be performed between the erase operation of the selected sub block and the erase verification operation of the unselected sub block. However, the reprogram operation of the unselected sub block may alternatively be performed after the erase operation of the selected sub block and the erase verification operation of the unselected sub block are completed. For example, where an erase operation is performed using an ISPE method, the erase operation and the erase verification operation constitute one erasure loop and whenever the erasure loop is repeated, erase voltage Vers is increased and the erase operation is performed with the increased erase voltage Vers. In this example, the reprogram operation of the unselected sub block may be performed after the erasure loops are completed.

As described above, in some embodiments of the inventive concept, where a sub blocks is erased, an adjacent sub block may be reprogrammed. The reprogramming restores data to the adjacent sub block where it is disturbed by the erase operation, which can improve reliability of the nonvolatile memory device.

Figure 16:
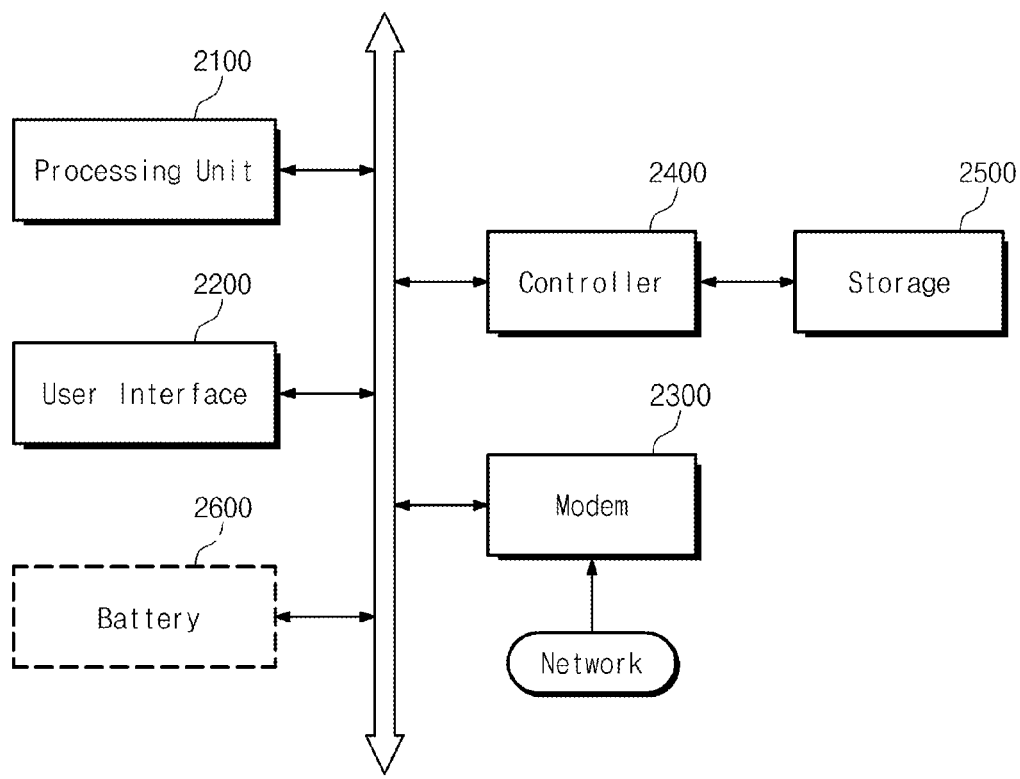
FIG. 16 is a block diagram of computer system according to an embodiment of the inventive concept.

FIG. 16 is a block diagram of computer system according to an embodiment of the inventive concept.

Referring to FIG. 16, the computer system comprises a processing unit 2100, a user interface 2200, a modem 2300 such as a baseband chipset, a memory controller 2400, and a multi-level memory device 2500 acting as a storage unit. Multi-level memory device 2500 can be implemented with a structure and operating characteristics similar to nonvolatile memory devices described above in relation to FIGS. 1 through 15. Where the computer system is a mobile device, a battery 2600 may be provided as a power supply. Although not illustrated in FIG. 16, the computer system may further comprise other common features such as an application chipset, a camera image processor (CIS), or a mobile DRAM.

Figure 17:
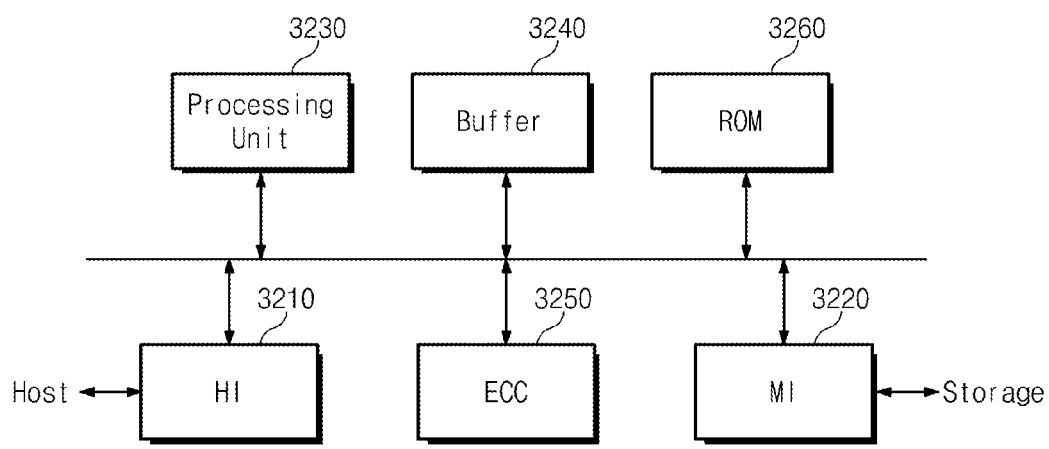
FIG. 17 is a block diagram of a memory controller illustrated in FIG. 16 according to an embodiment of the inventive concept.

FIG. 17 is a block diagram of memory controller 2400 illustrated in FIG. 16 according to an embodiment of the inventive concept.

Referring to FIG. 17, memory controller 2400 comprises a first interface 3210, a second interface 3220, a processing unit 3230, a buffer 3240, an error correction circuit (ECC) unit 3250 and read only memory (ROM) 3260.

First interface 3210 is configured to interface with one or more external devices, such as a host. Second interface 3220 is configured to interface with multi-level memory device 2500 of FIG. 16. Processing unit 3230 is configured to control general operations of memory controller 2400. Processing unit 3230 typically operates using hardware, software, and/or firmware such as a flash translation layer (FTL) stored in ROM 3260. Buffer 3240 is used to temporarily store data being transferred to an external destination through first interface 3210. Buffer 3240 is used to temporarily store data being transferred from the memory device through second interface 3220. ECC unit 3250 is configured to encode data to be stored and decoder data read from the memory device.

Figure 18:
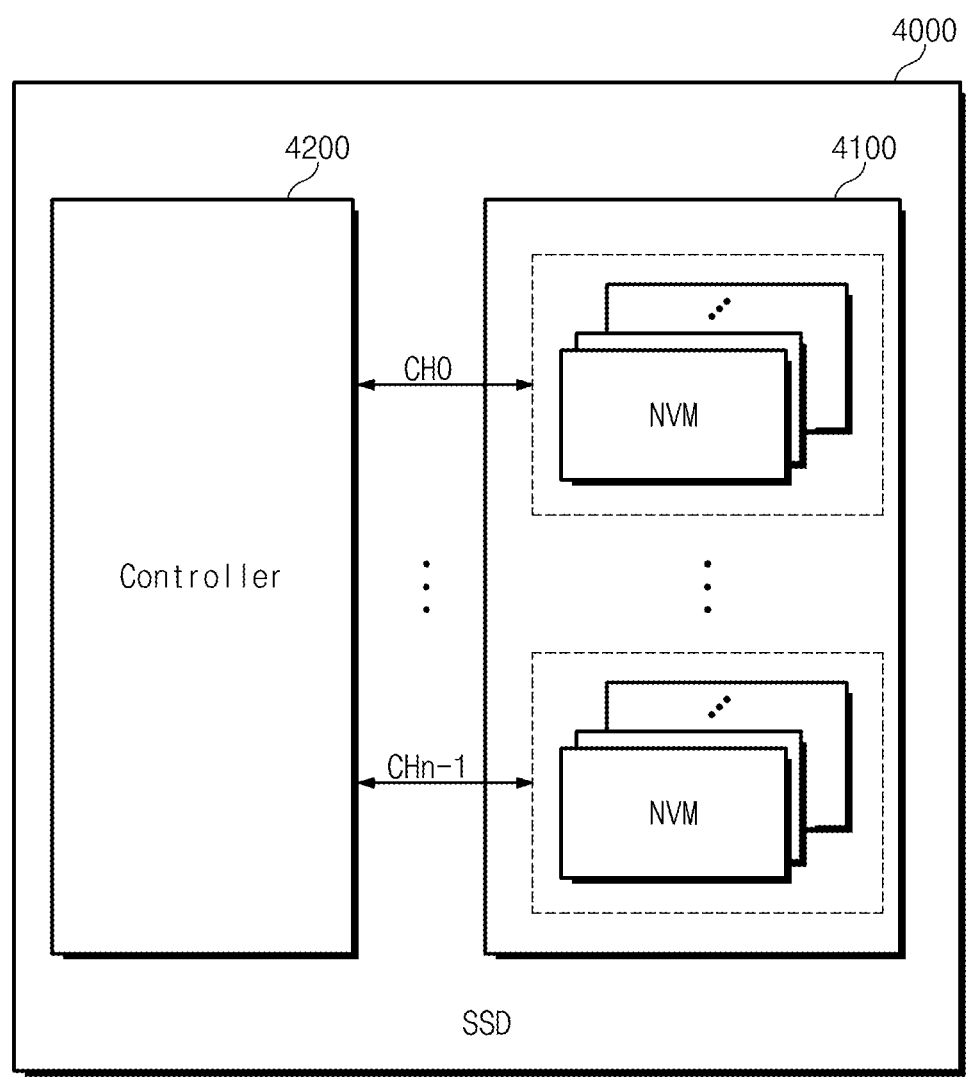
FIG. 18 is a block diagram of solid state drive according to an embodiment of the inventive concept.

FIG. 18 is a block diagram of a solid state drive 4000 according to an embodiment of the inventive concept.

Referring to FIG. 18, solid state drive 4000 comprises storage medium 4100 and a controller 4200. Storage medium 4100 is coupled to controller 4200 through a plurality of channels, and a plurality of nonvolatile memory devices is connected to each channel in common. Each of the nonvolatile memory devices can be implemented with a structure and operating characteristics similar to nonvolatile memory devices described above in relation to FIGS. 1 through 15.

Figure 19:
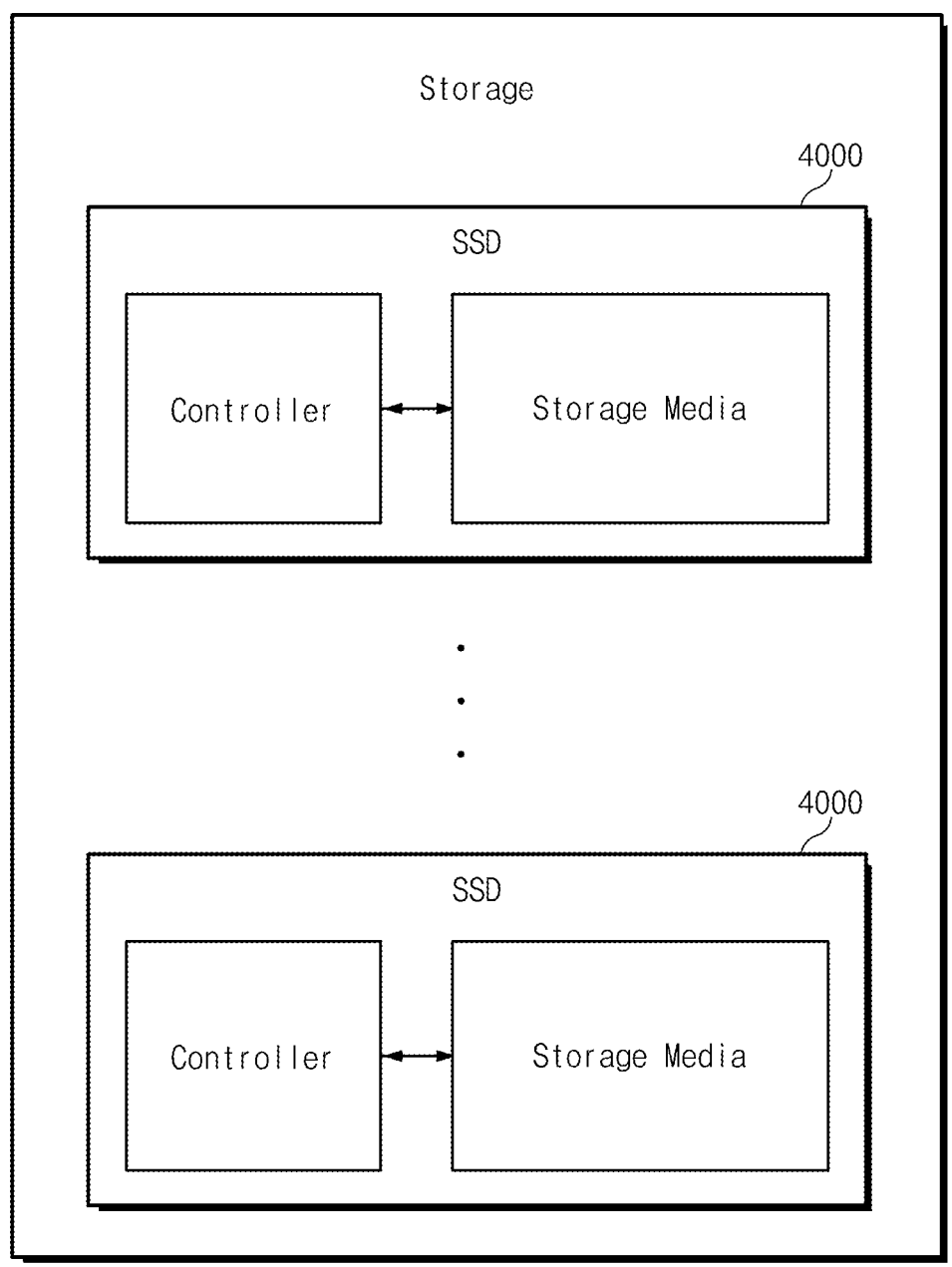
FIG. 19 is a block diagram of a storage apparatus incorporating the solid state drive of FIG. 18 according to an embodiment of the inventive concept.
Figure 20:
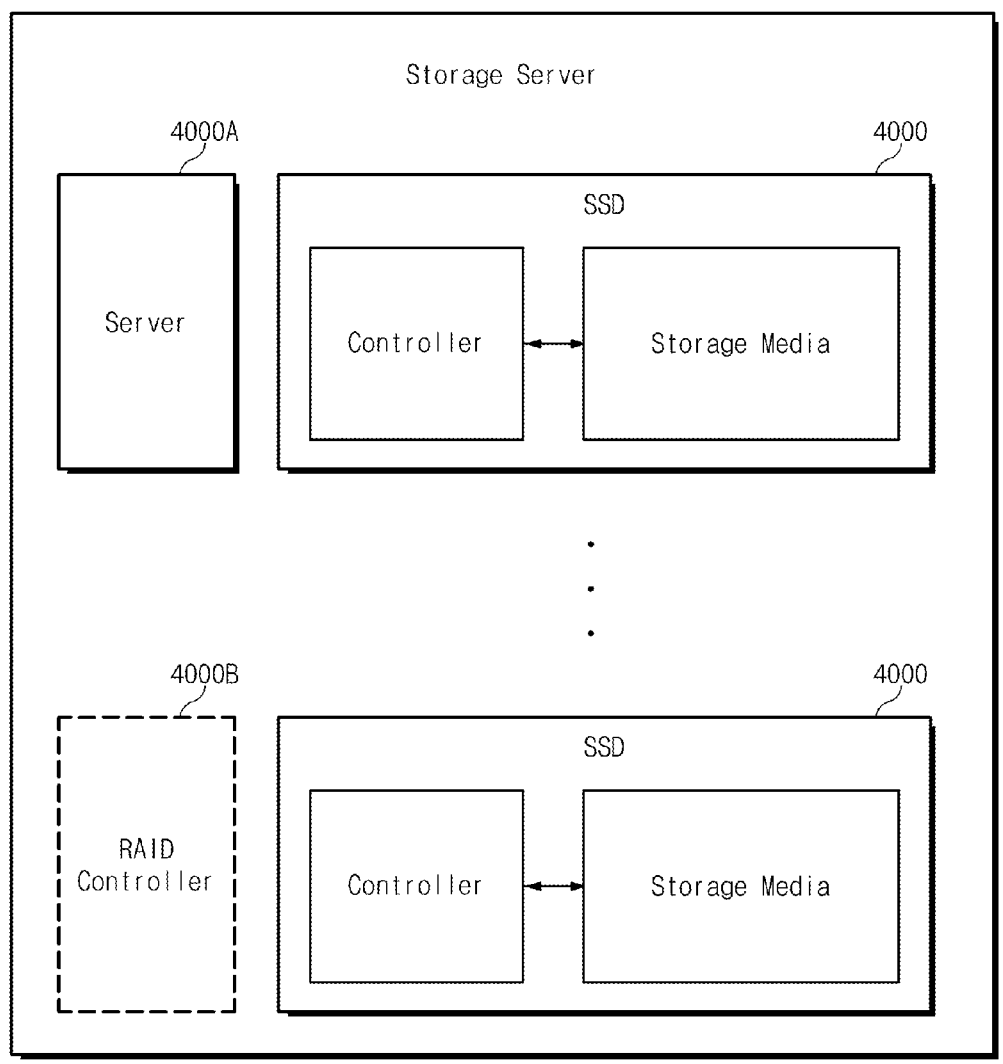
FIG. 20 is a block diagram of storage server using the solid state drive of FIG. 18 according to an embodiment of the inventive concept.

FIG. 19 is a block diagram of a storage apparatus incorporating solid state drive 4000 of FIG. 18 according to an embodiment of the inventive concept. FIG. 20 is a block diagram of storage server incorporating solid state drive 4000 of FIG. 18 according to an embodiment of the inventive concept.

In the example of FIG. 19, the storage apparatus comprises a plurality of solid state drives 4000 to provide a relatively large amount of data storage. In the example of FIG. 20, the storage server comprises a plurality of solid state drives 4000, a server 4000A, and a redundant array of independent disks (RAID) controller 4000B.

Figure 21:
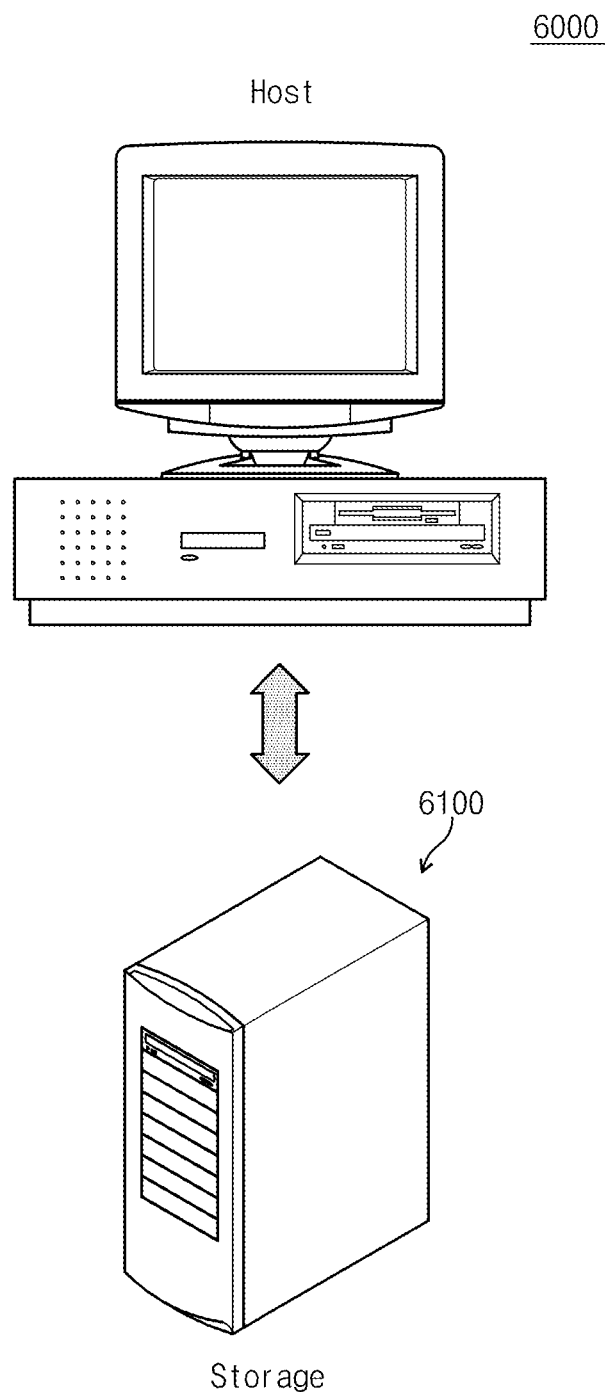
FIGS. 21, 22 and 23 are diagrams of systems providing data storage according to various embodiments of the inventive concept.
Figure 22:
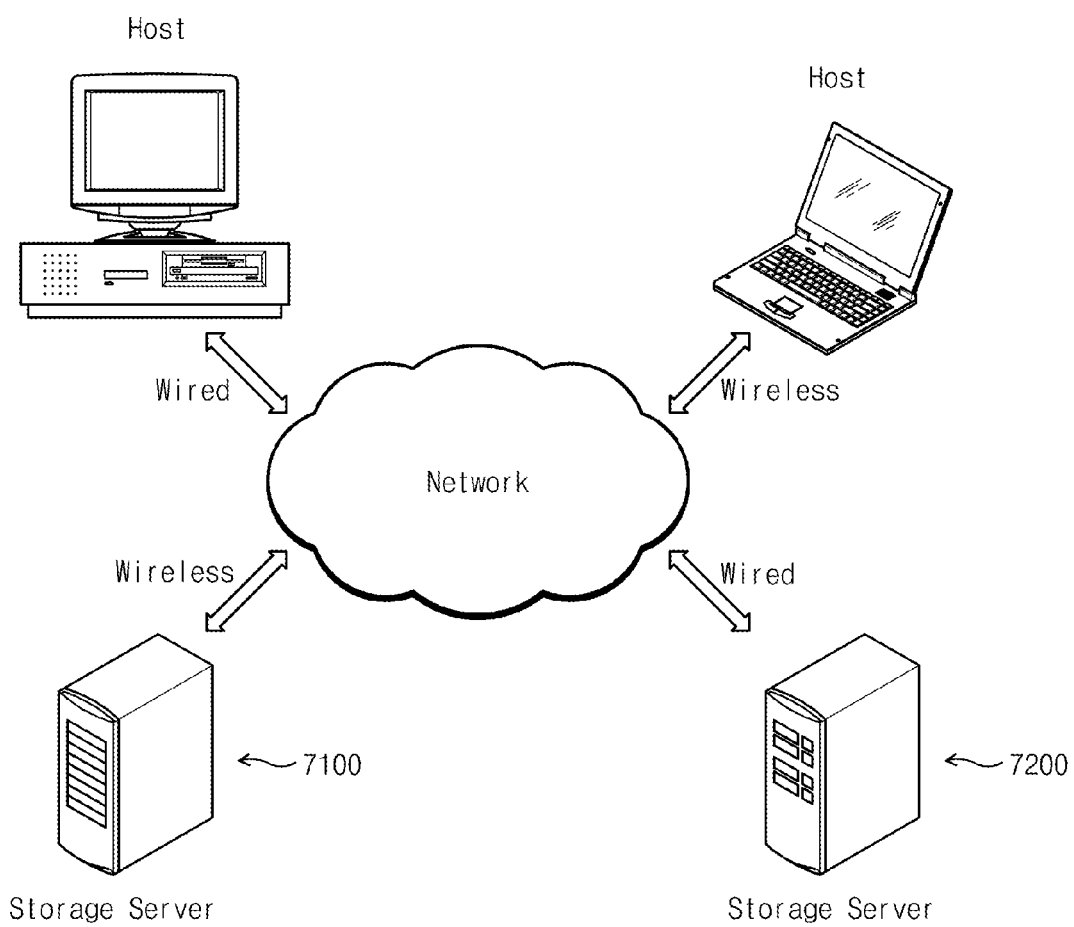
Figure 23:
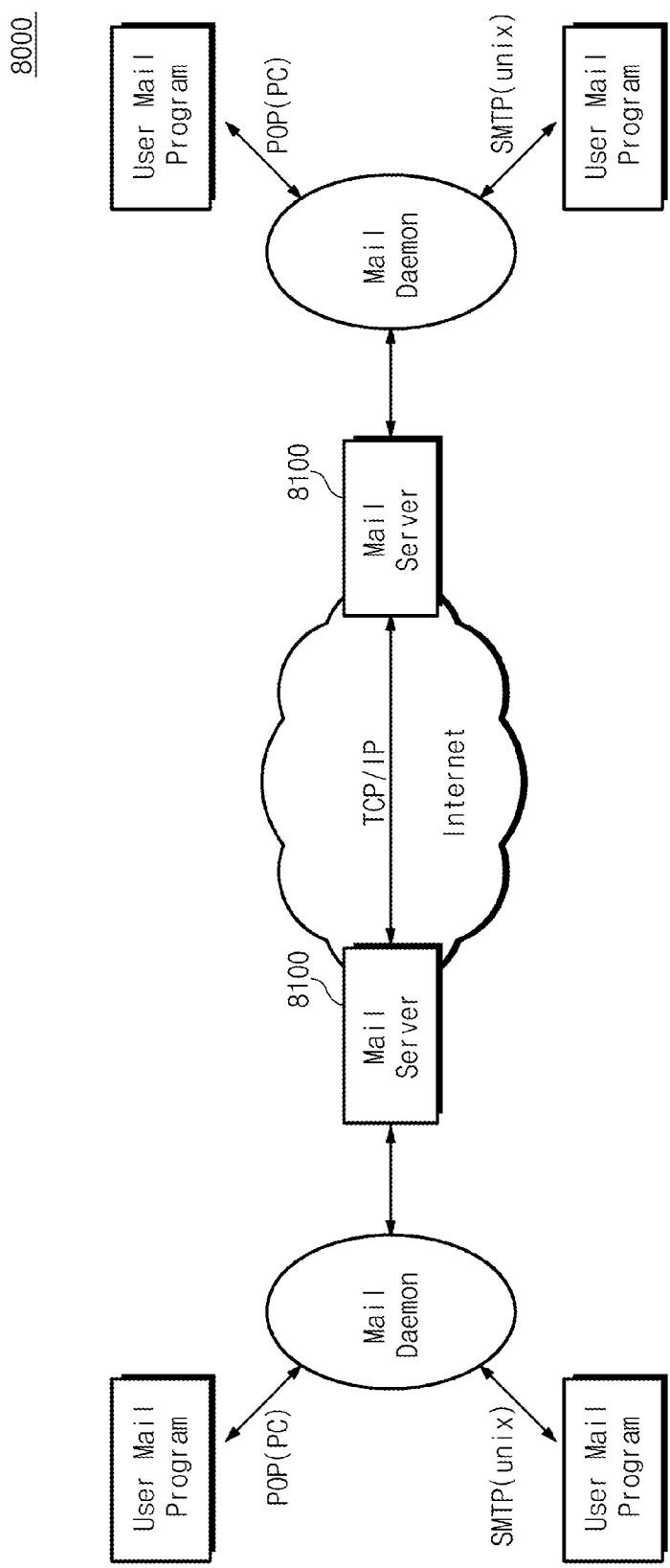

FIGS. 21, 22 and 23 are diagrams illustrating systems providing data storage according to various embodiments of the inventive concept.

In the embodiment of FIG. 21, a system 6000 comprises a storage apparatus 6100 that communicates with a host by wired and/or wireless communication. Storage apparatus 6100 can comprise one or more solid state drives such as that illustrated in FIG. 18, for example. In the embodiment of FIG. 22, a system 7000 comprises storage servers 7100 and 7200 that communicate with a host by wired and/or wireless communication. In the embodiment of FIG. 23, a network 800 comprises a mail server 8100 comprising a solid state drive such as that illustrated in FIG. 18.

Figure 24:
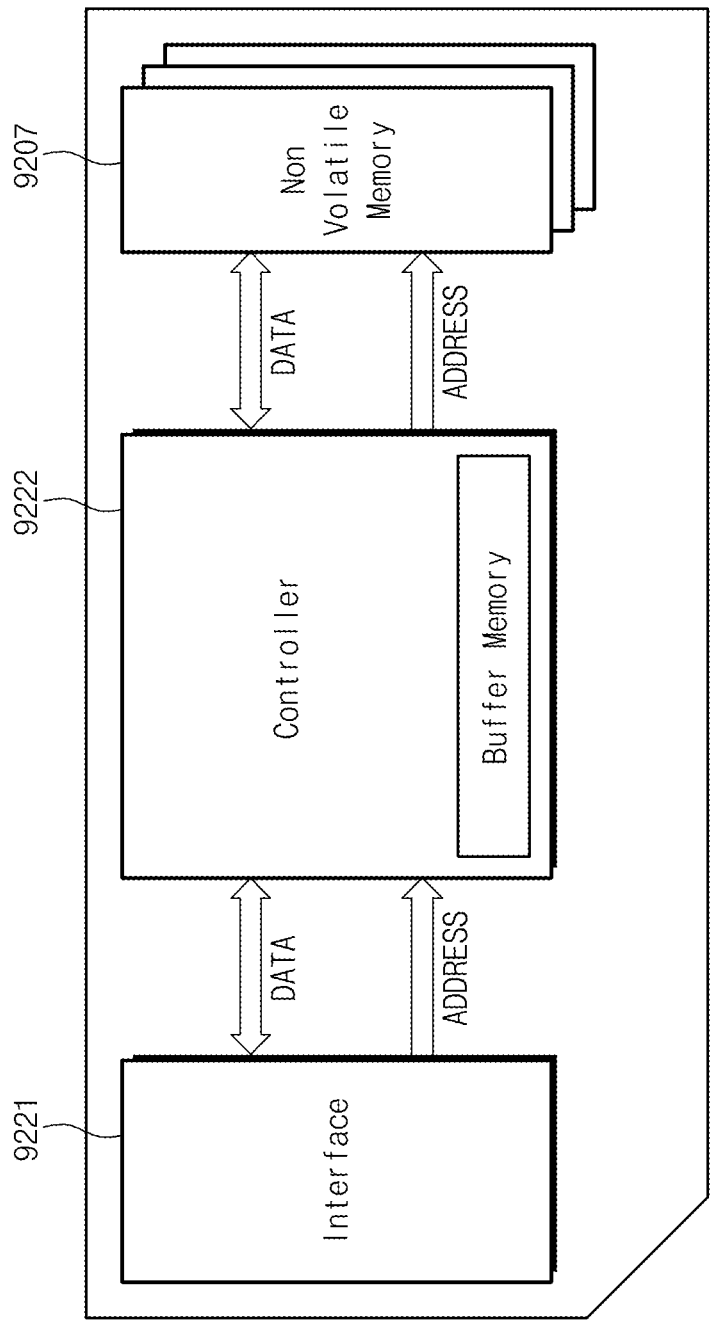
FIG. 24 is a block diagram of memory card according to an embodiment of the inventive concept.

FIG. 24 is a block diagram of memory card according to an embodiment of the inventive concept. The memory card can be, for example, a MMC card, a SD card, a multiuse card, a micro SD card, a memory stick, a compact SD card, an ID card, a PCMCIA card, a SSD card, a chip card, a smart card, or a USB card.

Referring to FIG. 24, the memory card comprises an interface 9221 that interfaces with an external device such as a host, a controller 9222 comprising a buffer memory and configured to control operations of the memory card, and one or more nonvolatile memory devices 9207. Controller 9222 is coupled to nonvolatile memory device 9207 and interface 9221 through data bus DATA and address bus ADDRESS.

Controller 9222 typically comprises a processor configured to control program, read and erase operations of nonvolatile memory device 9207. Nonvolatile memory device 9207 can be implemented with a structure and operating characteristics similar to nonvolatile memory devices described above in relation to FIGS. 1 through 15.

Controller 9222 and/or nonvolatile memory device 9207 can be packaged using various types of packages or package configurations, such as package on package (PoP), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP), or wafer-level processed stack package (WSP).

As indicated by the foregoing, in some embodiments, a nonvolatile memory device comprises a memory block divided into a plurality of sub blocks. An erase operation of the memory block is performed in sub block units. Erasure of a first sub block may affect data stored in a second sub block adjacent to the first sub block. Accordingly, the second sub block may be reprogrammed following erasure of the first sub block. This can potentially improve the reliability of the nonvolatile memory device.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A method of operating a nonvolatile memory device comprising a memory block having memory cells stacked in a three dimensional structure, the method comprising:
performing an erase operation to erase a selected sub block among sub blocks of the memory block;
performing a verification operation comprising determining whether program states of memory cells of an unselected sub block of the memory block have changed as a consequence of the erase operation; and
performing a reprogramming operation to reprogram at least a portion of the unselected sub block upon determining that at least one of the program states have changed as a consequence of the erase operation.

2. The method of claim 1, wherein each of the sub blocks comprises multiple cell strings arranged in a direction perpendicular to a substrate.

3. The method of claim 1, wherein the verification operation comprises determining target program states of the memory cells of the unselected sub block.

4. The method of claim 1, wherein the verification operation is performed using a selection read voltage and a program verification voltage corresponding to program states of the memory cells and wherein program states are determined to be changed where threshold voltages of the memory cells are higher than the selection read voltage and lower than the program verification voltage.

5. The method of claim 1, wherein the reprogramming operation is performed without input data from a source external to the nonvolatile memory device.

6. The method of claim 1, further comprising, before the erase operation, reading data stored in memory cells of the unselected sub block.

7. The method of claim 6, further comprising temporarily storing the data read from the memory cells of the unselected sub block in a read circuit of the nonvolatile memory device until the reprogramming operation is completed.

8. The method of claim 7, further comprising performing the reprogramming operation using the data temporarily stored in the read circuit.

9. The method of claim 6, further comprising performing the verification operation using a program verification voltage corresponding to program states of the memory cells and determining that the program states are changed where threshold voltages of the memory cells are lower than the program verification voltage.

10. The method of claim 1, further comprising an erase verification operation comprising verifying whether the selected sub block is successfully erased.

11. The method of claim 10, wherein the erase operation and the erase verification operation are performed in successive loops until the selected sub block is successfully erased, and the reprogramming operation is performed thereafter.

12. A nonvolatile memory device, comprising:
a memory cell array comprising a memory block having memory cells stacked in a three dimensional structure; and
a controller configured to control the memory cell array such that sub blocks of the memory block are erased independent of each other, wherein an erase operation erases a selected sub block among sub blocks of the memory block, a verification operation determines whether program states of memory cells of an unselected sub block of the memory block have changed as a consequence of the erase operation, and a reprogramming operation that reprograms at least a portion of the unselected sub block upon determining that at least one of the program states have changed as a consequence of the erase operation.

13. The nonvolatile memory device of claim 12, wherein the sub blocks are configured to share string select transistors and ground select transistors of the memory block.

14. The nonvolatile memory device of claim 12, wherein the controller is configured to apply a program pulse without requiring data input from a source external to the nonvolatile memory device.

15. The nonvolatile memory device of claim 12, wherein the controller is configured to reprogram at least a portion the unselected sub block comprising memory cells having program states determined to be changed according to the verification operation.

16. The nonvolatile memory device of claim 12, further comprising a read/write circuit configured to write data in the memory cell array or read data from the memory cell array before erasing the selected sub block, wherein the controller is configured to temporarily store data from memory cells of the unselected sub block in the read/write circuit and to reprogram the unselected sub block using the temporarily stored data.

17. A method of operating a nonvolatile memory device comprising a memory block formed in a stacked three dimensional structure, comprising:
storing a backup copy of data stored in a first sub block of the memory block;
erasing a second sub block of the memory block located adjacent to the first sub block; and
reprogramming the first sub block based on the backup copy after erasing the second sub block.

18. The method of claim 17, wherein the first and second sub blocks each comprise a plurality of NAND strings arranged perpendicular to a substrate.

19. The method of claim 17, further comprising determining whether the second sub block has been successfully erased, and reprogramming the first sub block as a consequence of determining that the second sub block has been successfully erased.

20. The method of claim 17, further comprising verifying whether program states of memory cells in the first sub block have changed as a consequence of erasing the second sub block, and reprogramming the first sub block as a consequence of determining that the program states of at least one memory cell in the first sub block has changed as a consequence of erasing the second sub block.

* * * * *